(12) United States Patent
Cho et al.

(10) Patent No.: US 11,812,655 B2
(45) Date of Patent: Nov. 7, 2023

(54) DISPLAY DEVICE HAVING A SUPPORT PLATE

(71) Applicant: SAMSUNG DISPLAY CO., LTD., Yongin-si (KR)

(72) Inventors: Hyun Jun Cho, Seoul (KR); Yong Kwan Kim, Yongin-si (KR); Yong Hyuck Lee, Cheonan-si (KR); Soh Ra Han, Cheonan-si (KR); Kyu Young Kim, Suwon-si (KR); Han Sun Ryou, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/649,042

(22) Filed: Jan. 26, 2022

(65) Prior Publication Data

US 2022/0238821 A1    Jul. 28, 2022

(30) Foreign Application Priority Data

Jan. 27, 2021 (KR) .......................... 10-2021-0011293

(51) Int. Cl.
| | | |
|---|---|---|
| *G06F 3/046* | (2006.01) | |
| *H10K 77/10* | (2023.01) | |
| *G06F 3/044* | (2006.01) | |
| *H10K 50/86* | (2023.01) | |
| *H10K 59/40* | (2023.01) | |
| *H10K 102/00* | (2023.01) | |

(52) U.S. Cl.
CPC .......... *H10K 77/111* (2023.02); *G06F 3/0443* (2019.05); *H10K 50/86* (2023.02); *H10K 59/40* (2023.02); *G06F 2203/04102* (2013.01); *H10K 2102/311* (2023.02)

(58) Field of Classification Search
CPC ............... G09G 3/035; G06V 40/1306; G06V 4040/12; G06F 1/1652; G06F 3/046; G09F 9/301
See application file for complete search history.

(56) References Cited

U.S. PATENT DOCUMENTS

| | | | | |
|---|---|---|---|---|
| 6,099,745 | A * | 8/2000 | McKenney | H05K 3/4691 |
| | | | | 216/36 |
| 9,639,121 | B2 * | 5/2017 | Min | H05K 1/038 |
| 10,680,210 | B2 * | 6/2020 | Lee | H05K 5/0017 |
| 10,897,826 | B2 * | 1/2021 | Jung | H05K 1/181 |
| 10,976,873 | B2 * | 4/2021 | Shin | G06F 1/1643 |
| 11,513,555 | B2 * | 11/2022 | Lee | G06F 1/1652 |
| 2018/0070460 | A1 * | 3/2018 | Han | G06F 1/1641 |
| 2018/0335679 | A1 | 11/2018 | Hashimoto et al. | |

(Continued)

FOREIGN PATENT DOCUMENTS

| | | |
|---|---|---|
| KR | 1020190135173 | 12/2019 |
| KR | 1020200084495 | 7/2020 |

*Primary Examiner* — Olga V Merkoulova
(74) *Attorney, Agent, or Firm* — F. CHAU & ASSOCIATES, LLC

(57) ABSTRACT

A display device includes a display panel having a front surface where images are displayed; a rear-side layer disposed on a rear surface of the display panel, including a plurality of conductive patterns and having first surface unevenness on a front surface thereof; and a support plate disposed between the display panel and the rear-side layer and having a flat surface on a front surface thereof. The support plate includes glass or ceramic.

24 Claims, 20 Drawing Sheets

(56) References Cited

U.S. PATENT DOCUMENTS

| | | | | |
|---|---|---|---|---|
| 2019/0165300 A1* | 5/2019 | Lee | .................... | H01L 51/5237 |
| 2019/0245955 A1* | 8/2019 | Lee | .................... | H04M 1/0237 |
| 2020/0022267 A1* | 1/2020 | Han | ...................... | B32B 5/18 |
| 2020/0209998 A1* | 7/2020 | Shin | ...................... | G06F 1/1641 |
| 2020/0225699 A1* | 7/2020 | Yu | ...................... | H04M 1/0216 |
| 2020/0371564 A1* | 11/2020 | Kim | .................... | H05K 5/0226 |
| 2021/0004048 A1* | 1/2021 | Ha | .................... | G06V 40/1306 |
| 2022/0129094 A1* | 4/2022 | Tatsuno | ............... | G06F 1/1616 |

* cited by examiner

DISPLAY DEVICE HAVING A SUPPORT PLATE

This application claims priority to Korean Patent Application No. 10-2021-0011293, filed on Jan. 27, 2021 in the Korean Intellectual Property Office, the disclosure of which is herein incorporated by reference in its entirety.

TECHNICAL FIELD

The present disclosure relates to a display device and, more specifically, to a display device including a support plate.

DISCUSSION OF THE RELATED ART

Display devices are frequently used to display many different types of information. For example, display devices are being employed by a variety of electronic devices such as smart phones, digital cameras, laptop computers, satellite navigation devices, and smart televisions.

Recently, flexible display devices have been introduced to provide a wide display screen while providing for a more portable form factor when not in use. For example, a bendable display device in which the display panel can be bent, a rollable display device in which the display panel can be rolled, and a foldable display device in which the display panel can be folded, etc. are under the development.

Many display devices incorporate elements for detecting a touch, such as a touch of a user's finger or that of an electronic stylus pen, particularly, an active stylus. By using a touch input with an electronic stylus pen, such a display device can sense the touch input more precisely than a display device using only a touch input by a part of the user's body, such as a finger.

SUMMARY

A display device includes a display panel having a front surface where images are displayed; a rear-side layer disposed on a rear surface of the display panel, including a plurality of conductive patterns and having first surface unevenness on a front surface thereof; and a support plate disposed between the display panel and the rear-side layer and having a flat surface on a front surface thereof, wherein the support plate includes glass or ceramic.

A display device includes a display panel having a front surface where images are displayed and including a folding area that is bendable and a first non-folding area extended from a first folding line disposed on one side of the folding area; a rear-side layer disposed on a rear surface of the display panel and having first surface unevenness on a front surface thereof; and a support plate disposed between the display panel and the rear-side layer and including a pattern portion overlapping the folding area and including a plurality of openings, and a first flat portion overlapping the first non-folding area and having a flat surface on a front surface thereof.

A display device includes a front stack structure; a rear stack structure; and a display panel disposed between the front stack structure and the rear stack structure and having a display area and a non-display area at least partially surrounding the display area, the display panel further having a folding area and a non-folding area disposed on two opposite sides of the folding area. The rear stack structure includes a plurality of conductive patterns having an uneven surface and a support plate comprising glass or ceramic.

The front stack structure may include a window, a window protection film, and a polarizing film. The rear stack structure may further include a panel-bottom protection film, a buffer layer, a digitizer layer, a shielding layer, and a heat dissipation layer.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
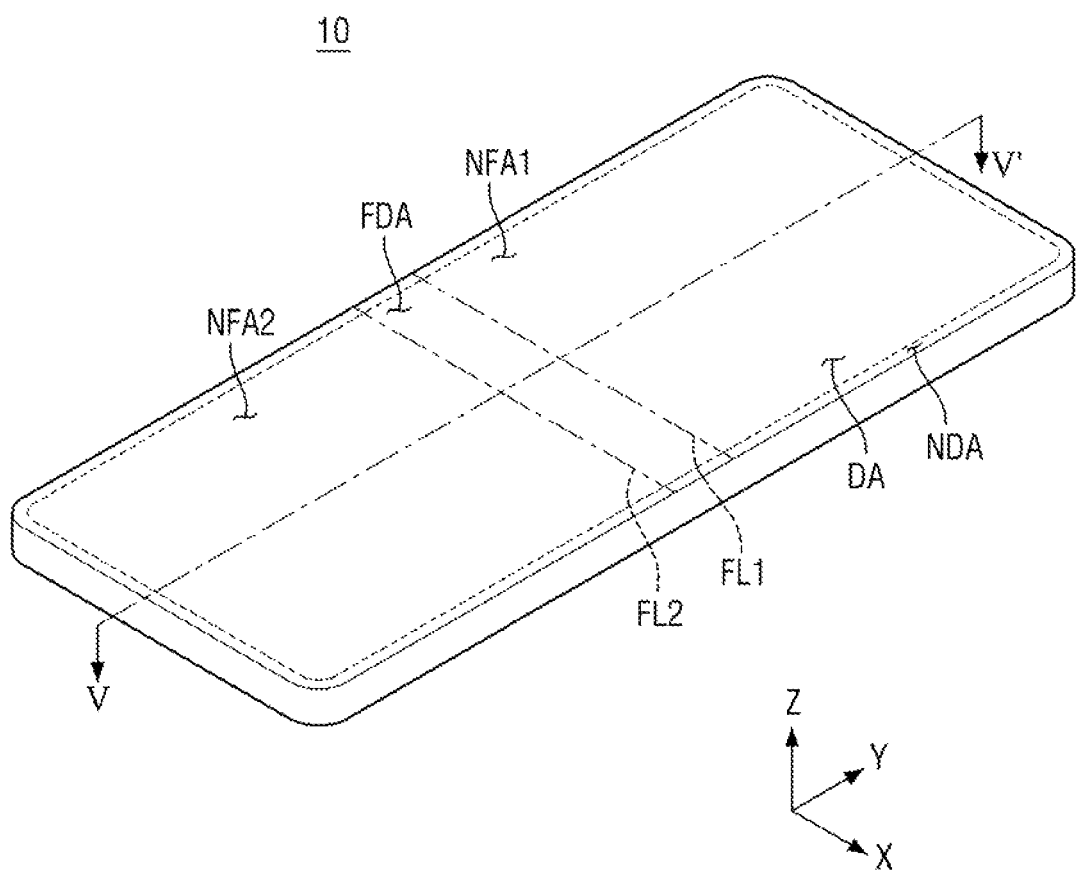
FIG. 1 is a perspective view of a display device according to an embodiment of the present disclosure when the display device is in an unfolded state.

Specific structural and functional descriptions of embodiments of the invention disclosed herein are provided for illustrative purposes. The invention may be embodied in many different forms without departing from the spirit and significant characteristics of the present disclosure. Therefore, the embodiments of the invention disclosed herein are not necessarily limiting on the invention.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification and drawings, the same reference numerals may refer to the same or like parts.

It will be understood that, although the terms "first," "second," "third" etc. may be used herein to describe various elements, components, regions, layers and/or sections, these elements, components, regions, layers and/or sections should not necessarily be limited by these terms. These terms are only to distinguish one element, component, region, layer or section from another element, component, region, layer or section. Thus, "a first element," "component," "region," "layer" or "section" discussed below could be termed a second element, component, region, layer or section without departing from the teachings herein.

As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

However, it is noted that when one structure is said to have a top surface and a bottom surface, other structures may share a common frame of reference and so top surfaces and bottom surfaces thereof may be in the same direction as the top and bottom surfaces of the one structure, respectively. For example, all top surfaces may point in a first direction and all bottom surfaces may point in a second direction that is opposite to the first direction.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" or "approximately" can mean within one or more standard deviations, or within ±30%, 20%, 10% or 5% of the stated value.

Hereinafter, embodiments of the present disclosure will be described in detail with reference to the accompanying drawings.

Figure 2:
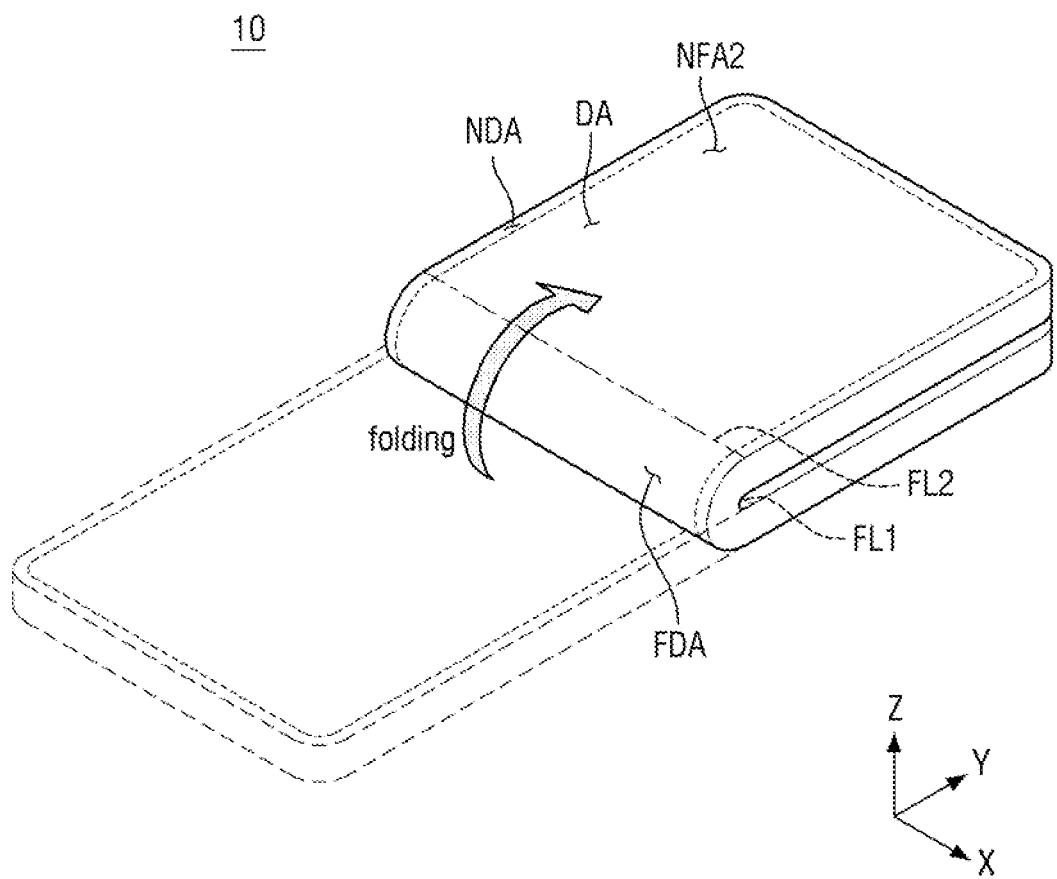
FIG. 2 is a perspective view showing the display device of FIG. 1 when it is in a folded state.

FIG. 1 is a perspective view of a display device according to an embodiment of the present disclosure when the display device is in an unfolded state. FIG. 2 is a perspective view showing the display device of FIG. 1 when it is in a folded state.

A display device 10 displays images and videos in a display area DA. The display device 10 may be included within a smart phone, a mobile phone, a tablet computer, a personal digital assistant (PDA), a portable multimedia player (PMP), a television set, a game console, a wristwatch-type wearable electronic device, a head-mounted display, a personal computer monitor, a laptop computer, a vehicle satellite navigation system, a car instrument cluster, a digital camera, a camcorder, an outdoor billboard, an electronic billboard, various medical apparatuses, various inspection devices, various home appliances including a display area such as a refrigerator and a laundry machine, and/or Internet of things (IoT) devices, etc. Examples of the foldable display device to be described later include, but are not necessarily limited to including, a foldable smartphone, a tablet computer, a laptop computer, etc.

As shown in FIGS. 1 and 2, a first direction X may refer to a direction parallel to a side of the display device 10, for example, the horizontal direction of the display device 10, when viewed from the top. A second direction Y may refer to a direction parallel to another side of the display device 10 that meet the side of the display device 10, for example, the vertical direction of the display device 10, when viewed from the top. A third direction Z may refer to the thickness direction of the display device 10.

The display device 10 may have a substantially rectangular shape or a square shape when viewed from the top. The display device 10 may be a rectangle having right-angular corners or rounded corners, when viewed from the top. The display device 10 may include four sides or edges. The display device 10 may include a pair of shorter sides extended in the first direction X and a pair of longer sides extended in the second direction Y, when viewed from the top.

As used herein, the term "extended in a direction" means that a longest dimension of the element is arranged in the indicated direction.

The display device 10 may include a front surface and a rear surface. As used herein, the front surface may refer to a surface (first surface) located on one side of one plane, and the rear surface may refer to a surface (second surface; the opposite surface) located on the opposite side of the plane. For example, when the front surface refers to the upper surface of an element, the rear surface refers to the lower surface of the element.

At least one of the front surface and the rear surface of the display device 10 may be a display surface. According to an embodiment of the present disclosure, the display surface may be located on the front surface of the display device 10, and no image may be displayed on the rear surface. In the following description, images are displayed only on the front surface of the display devices according to the embodiments of the present disclosure. It is, however, to be understood that the display device may be a double-sided display device in which images are displayed on both front and rear surfaces.

The display device 10 may be divided into a display area DA for displaying an image or a video and a non-display area NDA disposed around the display area DA, when viewed from the top, depending on whether images are displayed or not.

The display area DA may include a plurality of pixels. Each of the pixels is a unit for displaying an image. The pixels may include, but is not necessarily limited to including, a red pixel, a green pixel, and a blue pixel. The pixels may further include a white pixel. A plurality of pixels may be arranged sequentially and repeatedly when viewed from the top. For example, the pixels may be arranged in, but is not necessarily limited to, a matrix. The pixels may be disposed exclusively within the display area DA and there might be no pixels within the non-display area NDA.

The non-display area NDA may be proximate to the display area DA. A black matrix is disposed in the non-display area NDA to prevent leakage of light from adjacent pixels.

The non-display area NDA may at least partially surround the display area DA as shown in FIGS. 1 and 2. For example, the display area DA may have a rectangular shape, and the non-display area NDA may be disposed along each of the four sides of the display area DA. It is, however, to be understood that the present disclosure is not necessarily limited thereto. The display area DA may be partially surrounded by the non-display area NDA. For example, the non-display area NDA may be disposed only along three sides of the display area DA. In such case, the other side of the display area DA may form an edge of the display device 10.

The display device 10 may be a foldable device. As used herein, a foldable display device refers to a display device that can be folded to a noticeable extent (such as one in which opposite ends meet each other) without cracking or otherwise breaking and can be repeatedly switched between a folded state and an unfolded state.

The display device 10 may include a folding area FDA, a first non-folding area NFA1, and a second non-folding area NFA2. The display device 10 can be bent or folded at the folding area FDA, while it cannot be bent or folded at the first non-folding area NFA1 and the second non-folding area NFA2.

Thus, the folding area FDA is bendable while the first and second non-folding areas NFA1 and NFA2 are not bendable. As used herein, the phrase "bendable" means that the element may be bent, folded, flexed, or rolled, to a non-trivial and visible extent without cracking or otherwise breaking.

The first non-folding area NFA1 may be disposed on one side of the folding area FDA, and the second non-folding area NFA2 may be disposed on the opposite side of the folding area FDA.

The folding area FDA may be defined by a first folding line FL1 and a second folding line FL2 and may be bent or folded. The first folding line FL1 may be the boundary between the folding area FDA and the first non-folding area NFA1, and the second folding line FL2 may be the boundary between the folding area FDA and the second non-folding area NFA2.

The first folding line FL1 and the second folding line FL2 may be extended in parallel in the first direction X. The first folding line FL1 and the second folding line FL2 may traverse the display device 10 along the first direction X. The first folding line FL1 and the second folding line FL2 may have a predetermined interval along the extension direction. According to the embodiment of FIGS. 1 and 2, the display device 10 can be folded in the second direction Y. As a result, the width of the display device 10 in the second direction Y may be reduced to about half, so that the display device 10 is easier to carry than when the device is in the non-folded state.

The length of the first folding line FL1 may be equal to the length of the second folding line FL2. The length may be equal to the width of the folding area FDA in the first direction X. The width of the first non-folding area NFA1 in the first direction X may be equal to that of the second non-folding area NFA2. The width of the non-folding areas may be equal to the width of the folding area FDA in the first direction X.

When the first folding line FL1 and the second folding line FL2 are extended in the first direction X, the width of the folding area FDA in the second direction Y may be smaller than the width in the first direction X.

The width of the folding area FDA in the second direction Y may be smaller than the width of the first non-folding area NFA1 and the width of the second non-folding area NFA2 in the second direction Y.

The width of the first non-folding area NFA1 may be, but is not necessarily limited to being, equal to that of the second non-folding area NFA2 in the second direction Y. In some embodiments, the widths of the first non-folding area NFA1 and the second non-folding area NFA2 in the second direction Y may be larger than the widths of the first non-folding area NFA1 and the second non-folding area NFA2 in the first direction X, respectively. It is, however, to be understood that the present disclosure is not necessarily limited thereto.

Each of the display area DA and the non-display area NDA may overlap at least one of the folding area FDA, the first non-folding area NFA1, and the second non-folding area NFA2. In the example shown in FIGS. 1 and 2, each of the display area DA and the non-display area NDA overlaps the folding area FDA, the first non-folding area NFA1 and the second non-folding area NFA2. As shown in FIGS. 1 and 2, the display area DA may be continuously disposed regardless of the boundaries of the non-folding areas NFA1 and NFA2 and the folding lines FL1 and FL2. It is, however, to be understood that the present disclosure is not necessarily limited thereto. For example, the display area DA may be disposed in the first non-folding area NFA1 while the display area DA might not be disposed in the second non-folding area NFA2. The display area DA may be disposed in the first non-folding area NFA1 and the second non-folding area NFA2 while the display area DA might not be disposed on at least one of the folding lines FL1 and FL2.

According to an embodiment of the present disclosure, the display device 10 can be folded as the display panel 1000 (see FIG. 5) or a layer, a panel and a substrate stacked thereon have flexibility so that they all are each able to be folded. According to some embodiments of the present disclosure, the display panel 1000 or at least some of the elements stacked thereon may be disconnected where they overlap the folding line FDA. The disconnected elements located in the non-folding areas NFA1 and NFA2, respectively, might not have flexible characteristics.

Figure 3:
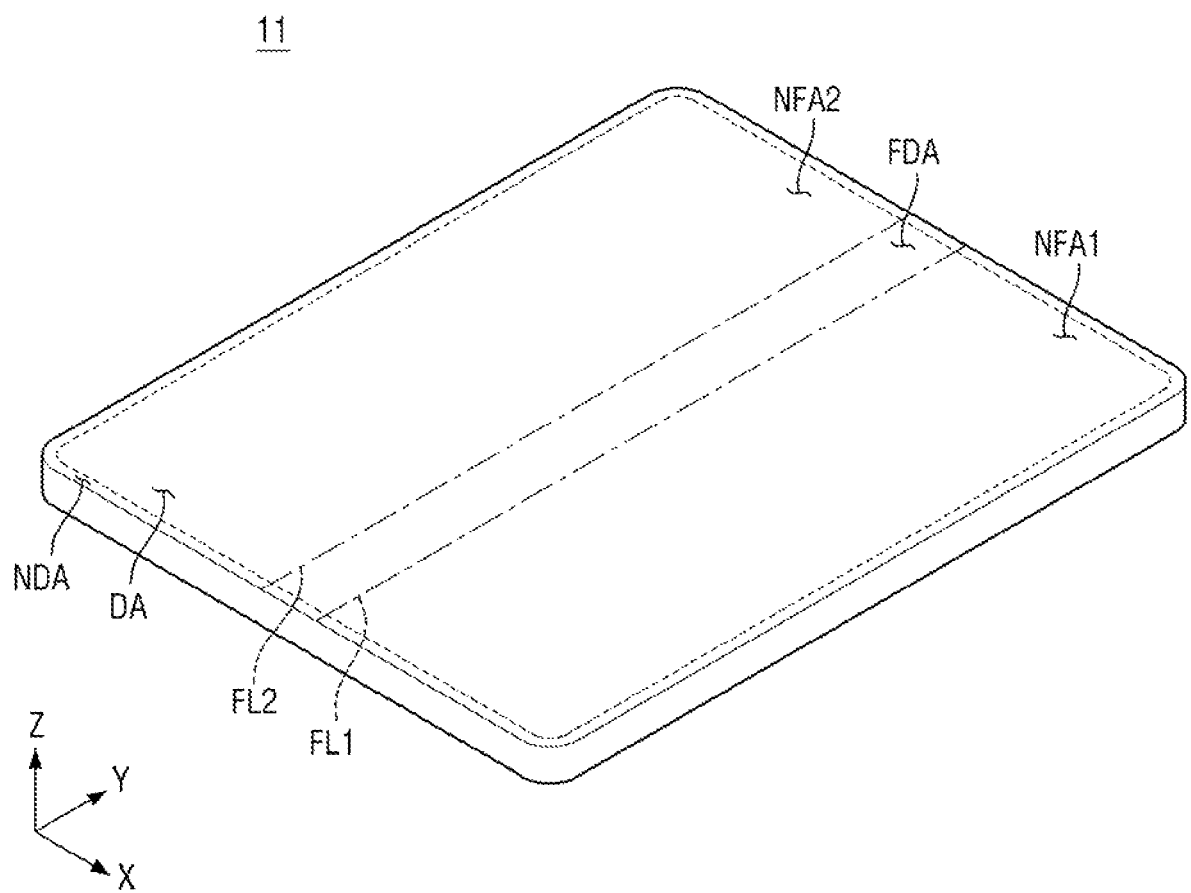
FIG. 3 is a perspective view of a display device according to an embodiment of the present disclosure when it is in an unfolded state.
Figure 4:
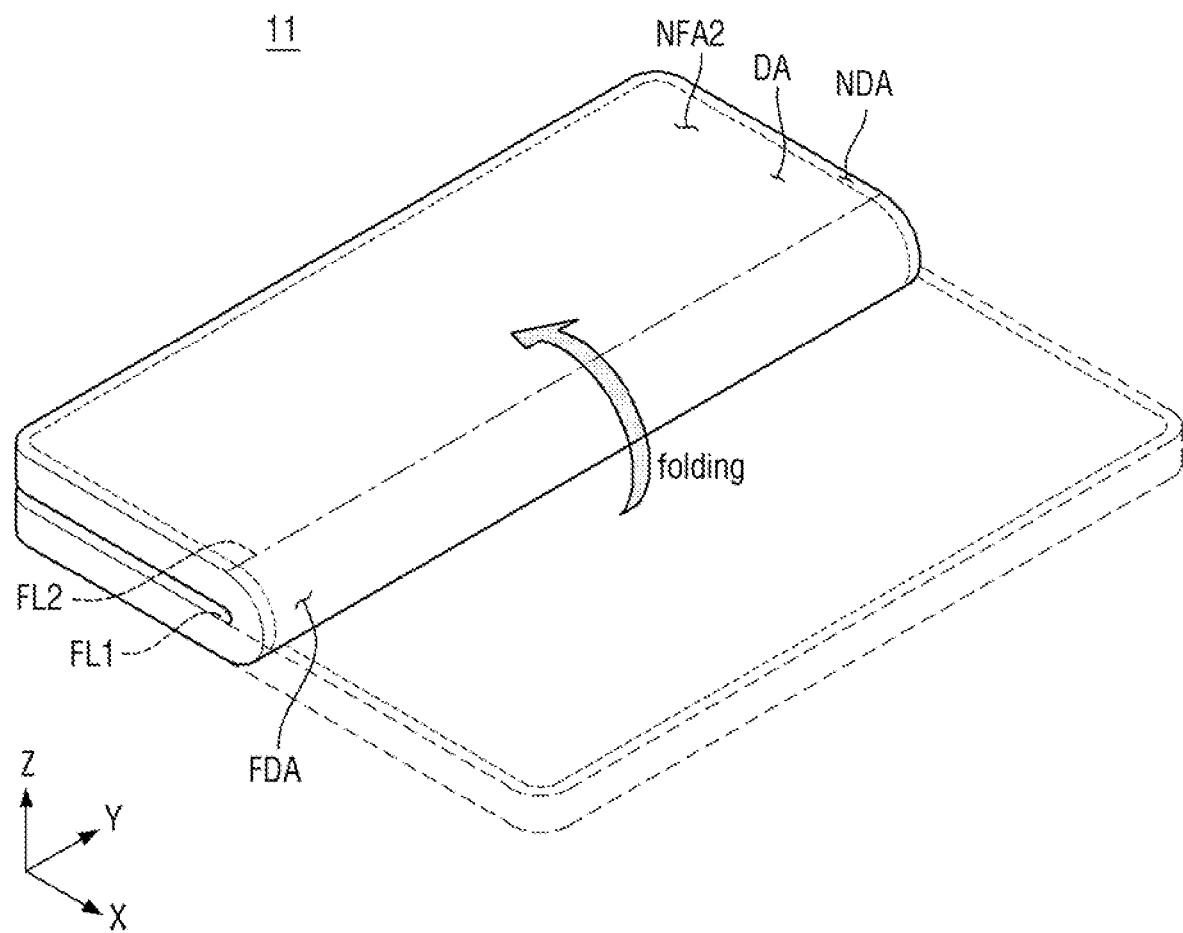
FIG. 4 is a perspective view showing the display device of FIG. 3 when it is in a folded state.

FIG. 3 is a perspective view of a display device according to an embodiment of the present disclosure when it is in an unfolded state. FIG. 4 is a perspective view showing the display device of FIG. 3 when it is in a folded state.

The embodiment of FIGS. 3 and 4 is substantially identical to the embodiment of FIGS. 1 and 2 except that a first folding line FL1 and a second folding line FL2 are extended in the second direction Y and the display device 11 can be folded in the first direction X, so that the width of the display device 11 in the first direction X can be reduced by approximately half, which is convenient for the user to carry the display device 11 when it is in the folded state. The following description will focus on the difference and it is to be understood that elements not described here are at least similar to corresponding elements that have been described elsewhere in the instant disclosure.

Referring to FIGS. 3 and 4, the first folding line FL1 and the second folding line FL2 of the display device may be extended in parallel in the second direction Y. The first folding line FL1 and the second folding line FL2 may traverse the display device 11 along the second direction Y. The first folding line FL1 and the second folding line FL2 may have a predetermined interval along the extension direction. According to the embodiment of FIGS. 3 and 4, the display device can be folded in the first direction X. As a result, the width of the display device in the first direction X may be reduced to about half, so that the display device is easy to carry when in the folded state.

When the first folding line FL1 and the second folding line FL2 are extended in the second direction Y, the width of the folding area FDA in the first direction X may be smaller than the width in the second direction Y.

The width of the folding area FDA in the first direction X may be smaller than the width of the first non-folding area NFA1 and the width of the second non-folding area NFA2 in the first direction X.

Hereinafter, a panel, a film, a member, etc. forming the above-described display device will be described in detail.

Figure 5:
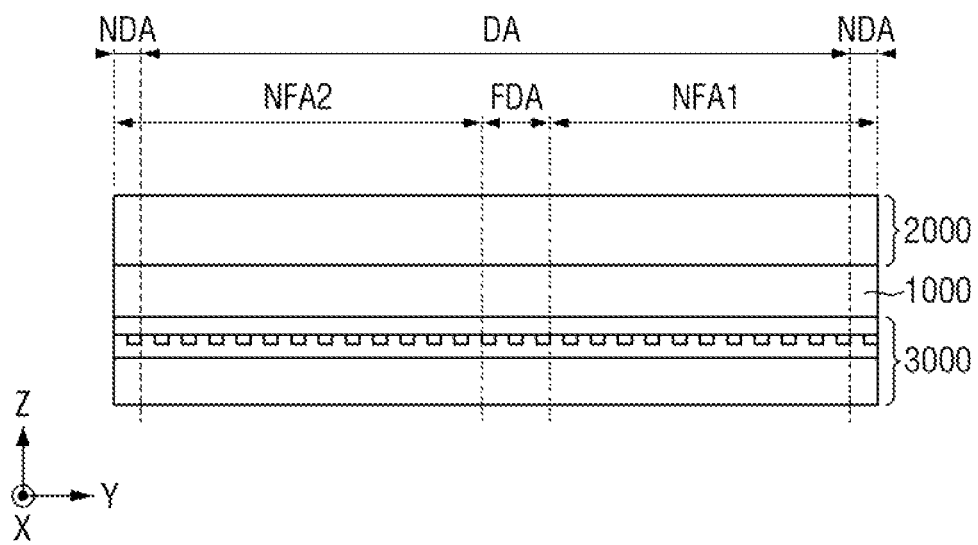
FIG. 5 is a schematic cross-sectional view, taken along line V-V' of FIG. 1.

FIG. 5 is a schematic cross-sectional view, taken along line V-V' of FIG. 1.

Referring to FIG. 5, a display device 10 according to an embodiment includes a display panel 1000, a front stack structure 2000 disposed on the front surface of the display panel 1000, and a rear stack structure 3000 disposed on the rear surface of the display panel 1000.

The display panel 1000 displays images and may include a self-luminous display panel such as an organic light-emitting display panel (OLED), an inorganic light-emitting display panel (inorganic EL), a quantum-dot light-emitting display panel (QED), a micro LED display panel (micro-LED), a nano LED display panel (nano-LED), a plasma display panel (PDP), a field emission display panel (FED) and a cathode ray display panel (CRT), as well as a light-receiving display panel such as a liquid-crystal display panel (LCD) and an electrophoretic display panel (EPD) In the following description, the organic light-emitting display panel will be described as an example of the display panel 1000, and the organic light-emitting display panel will be simply referred to as the display panel 1000 unless specifically stated otherwise. It is, however, to be understood that the embodiments of the present disclosure are not necessarily limited to the organic light-emitting display panel, and any other display panel listed above or well known in the art may be employed without departing from the scope of the present disclosure.

Figure 6:
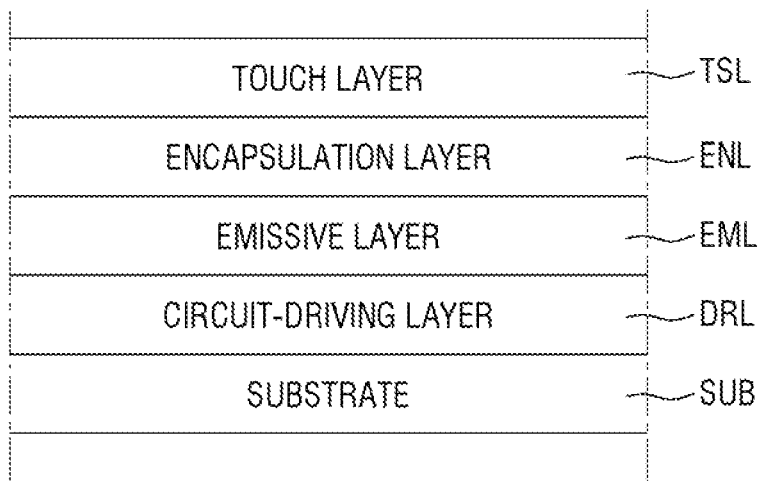
FIG. 6 is a cross-sectional view showing an example of the display panel of FIG. 5.

FIG. 6 is a cross-sectional view showing an example of the display panel of FIG. 5.

Referring to FIG. 6, the display panel 1000 may include a substrate SUB, a circuit driving layer DRL disposed on the substrate SUB, an emissive layer EML disposed on the circuit driving layer DRL, an encapsulation layer ENL disposed on the emissive layer EML, and a touch layer TSL disposed on the encapsulation layer ENL.

The substrate SUB may be a flexible substrate including a flexible polymer material such as polyimide. Accordingly, the display panel 1000 may be curved, bent, folded, or rolled. In some embodiments, the substrate SUB may include a plurality of sub-substrates overlapping one another in the thickness direction with barrier layers disposed therebetween. In such a case, each of the sub-substrates may be a flexible substrate.

The circuit-driving layer DRL may be disposed on the substrate SUB. The circuit-driving layer DRL may include a circuit for driving an emissive layer EML of each pixel. The circuit-driving layer DRL may include a plurality of thin-film transistors.

The emissive layer EML may be disposed on the circuit-driving layer DRL. The emissive layer EML may include an organic emitting layer. The emissive layer EML may emit light with various luminances depending on driving signals transmitted from the circuit-driving layer DRL.

The encapsulation layer ENL may be disposed on the emissive layer EML. The encapsulation layer ENL may include at least one inorganic layer to prevent permeation of oxygen or moisture into the emissive layer EML. In addition, the encapsulation layer ENL may include at least one organic film to protect the emissive layer EML from particles such as dust.

The touch layer TSL may be disposed on the encapsulation layer ENL. The touch layer TSL may sense a touch input and may perform the functions of a touch sensor. The touch layer TSL may include a plurality of sensing regions and sensing electrodes.

Although the touch sensor is integrated into the display panel 1000 in the form of the touch layer TSL in the example of FIG. 6, the present disclosure is not necessarily limited thereto. For example, the touch sensor may be implemented as a panel or film separate from the display panel 1000 and attached to the display panel 1000. In addition, the touch sensor may be omitted.

Referring back to FIG. 5, the front stack structure 2000 may be disposed on the front surface of the display panel 1000 where images are displayed. The rear stack structure 3000 may be disposed on the rear surface of the display panel 1000. The front stack structure 2000 and the rear stack structure 3000 may each include layers performing different functions. An example of the arrangement of the display panel 1000 and the stack structures 2000 and 3000 are shown in FIGS. 7 and 8.

Figure 7:
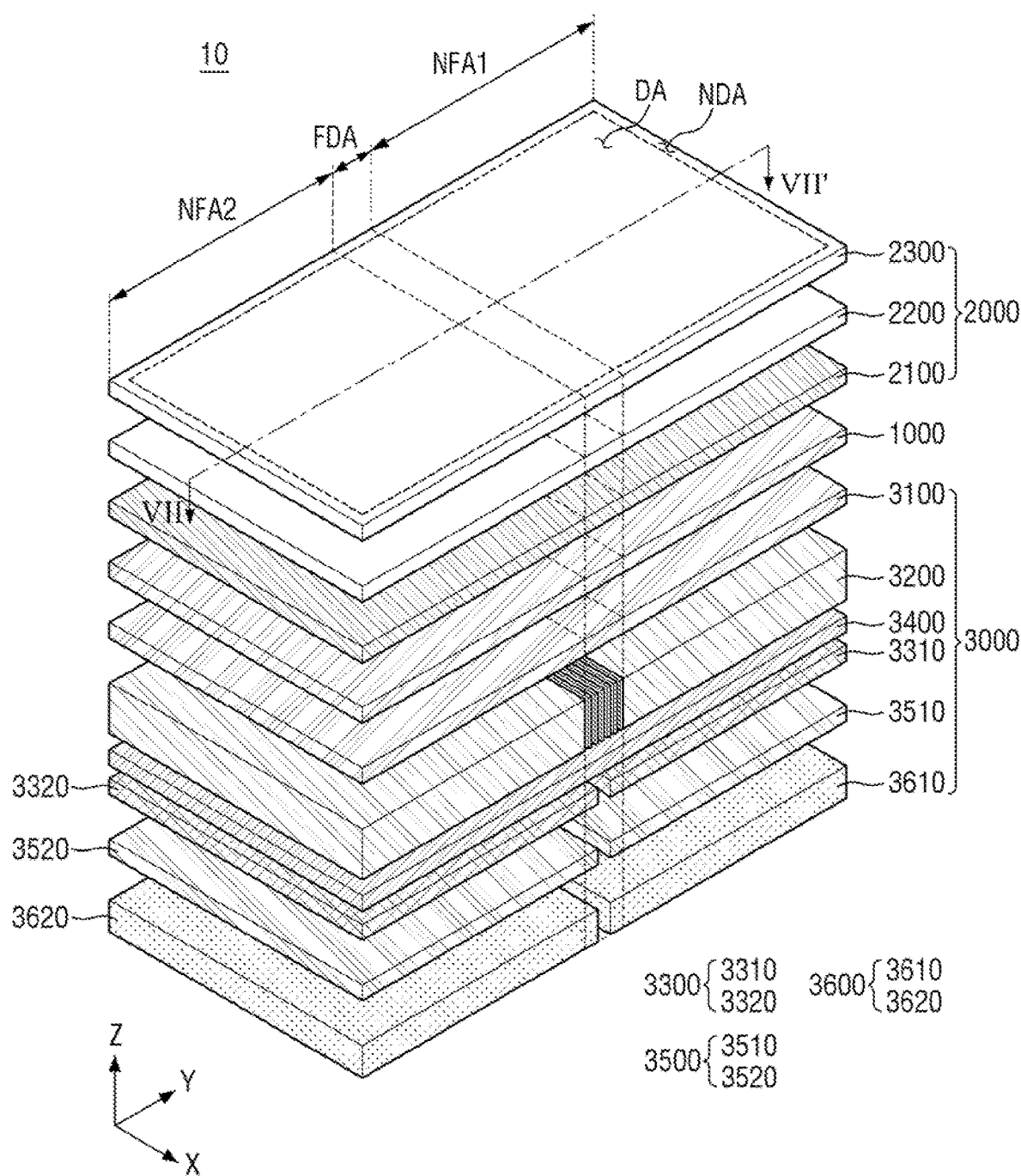
FIG. 7 is an exploded, perspective view of the display device according to the structure of FIG. 5.

FIG. 7 is an exploded, perspective view of the display device according to the embodiment of FIG. 5. FIG. 8 is a cross-sectional view showing an example of a display device taken along line VII-VII' of FIG. 7.

Figure 8:
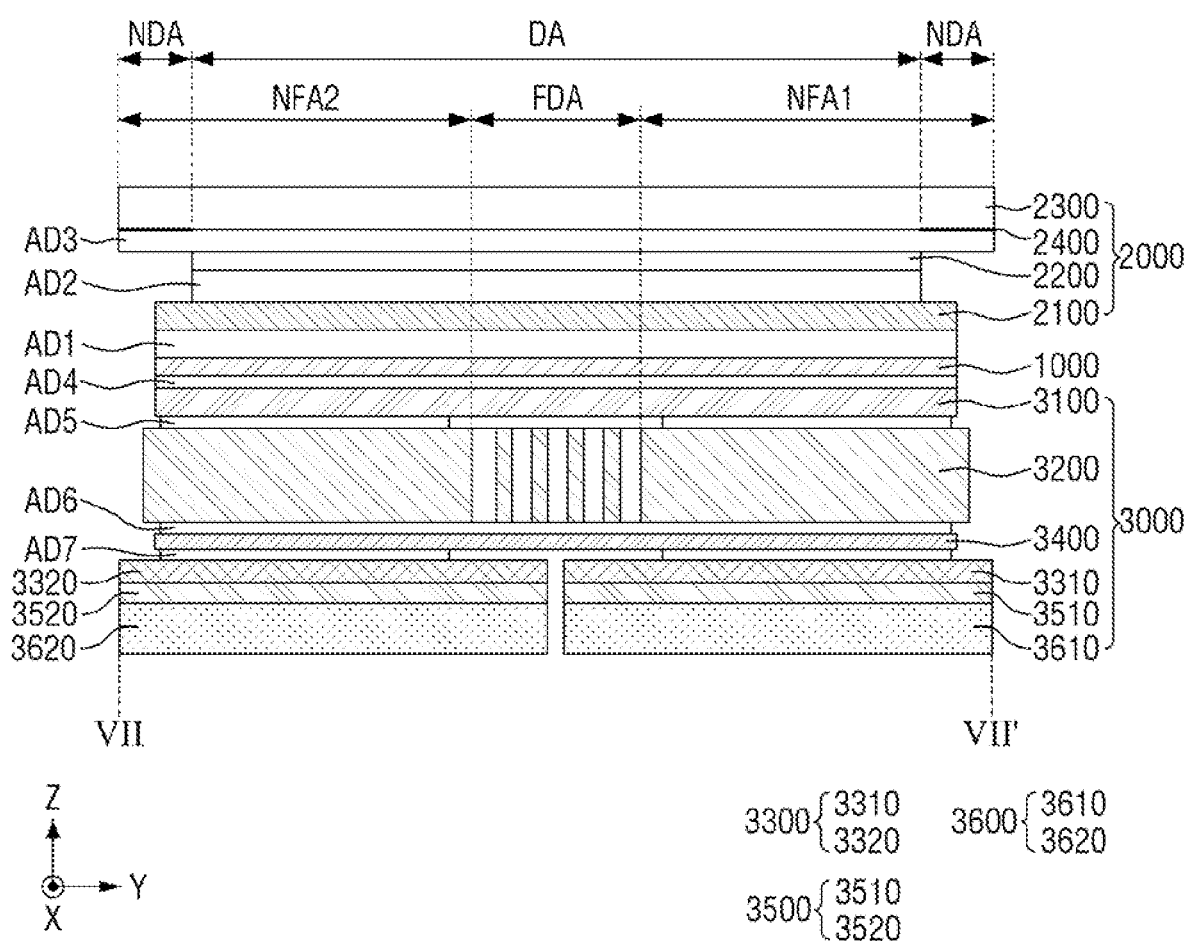
FIG. 8 is a cross-sectional view showing an example of a display device taken along line VII-VII' of FIG. 7.

Referring to FIGS. 7 and 8, the front stack structure 2000 may include, for example, a window 2200, a window protection film 2300, a polarizing film 2100 and/or adhesive layers attaching them together. The rear stack structure 3000 disposed on the rear surface of the display panel 1000 where no image is displayed may include a panel-bottom protection film 3100, a support plate 3200, a buffer layer 3400, a digitizer layer 3300, a shielding layer 3500 and/or a heat dissipation layer 3600.

More specifically, the polarizing film 2100 may be attached on the front surface of the display panel 1000 by a first adhesive layer AD1. The polarizing film 2100 can reduce reflection of external light.

A window 2200 may be disposed on the polarizing film 2100. The window 2200 may be made of a transparent material, and may include, for example, glass or plastic. When the window 2200 includes glass, an ultra thin glass (UTG) having a thickness of 0.1 mm or less may be employed in order to have flexible properties. When the window 2200 is made of plastic, the window 2200 may include, but is not necessarily limited to, a transparent polyimide film. The window 2200 may be attached to the front surface of the polarizing film 2100 by a second adhesive layer AD2.

The window protection film 2300 is disposed on the window 2200. The window protection film 2300 may be attached to the front surface of the window 2200 by a third adhesive layer AD3. The window protection film 2300 may perform at least one function including anti-scattering when the window 2200 is broken, shock absorption, anti-scratch, anti-fingerprint, and anti-glare. The window protection film 2300 may be made of a resin or a film having flexible properties.

Each of the first to third adhesive layers AD1, AD2 and AD3 may include a transparent adhesive film or a transparent adhesive resin.

The front stack structure 2000 may further include a light-blocking layer 2400. The light-blocking layer 2400 may be disposed in the non-display area NDA. The light-blocking layer 2400 may include a material that can block light. For example, the light-blocking layer 2400 may include an inorganic black pigment such as carbon black or an organic black pigment. Although the light-blocking layer 2400 is formed on the rear surface of the window protection film 2300 in the drawings, the present disclosure is not necessarily limited thereto. The light-blocking layer 2400 may be disposed on the front and/or rear surface of the window 2200, or may be disposed on the front surface of the window protection film 2300.

All of the elements of the above-described front stack structure 2000 may be disposed across the first non-folding area NFA1, the folding area FDA, and the second non-folding area NFA2 of the display device 10. When the display device 10 is in a folded state, the front stack structure 2000 is folded together. Accordingly, all of the layers of the front stack structure 2000 may be formed of a foldable material or structure. Unlike the rear stack structure 3000 to be described later, the front stack structure 2000 disposed on the front surface of the display panel 1000 where images are displayed may have the same thickness and shape in the folding area FDA as well as the first non-folding area NFA1 and the first non-folding area NFA1. It is, however, to be understood that the embodiments of the present disclosure are not necessarily limited thereto.

The panel-bottom protection film 3100 may be disposed on the rear surface of the display panel 1000. The panel-bottom protection film 3100 may be attached to the rear surface of the display panel 1000 by a fourth adhesive layer AD4. The panel-bottom protection film 3100 can support the display panel 1000 and protect the rear surface of the display panel 1000. The panel-bottom protection film 3100 may include, but is not necessarily limited to including, a plastic film such as a polyethylene terephthalate (PET) film.

Although the panel-bottom protection film 3100 is integrally formed and disposed in the first non-folding area NFA1, the folding area FDA and the second non-folding area NFA2 in the example shown in FIGS. 7 and 8, the present disclosure is not necessarily limited thereto. For example, the panel-bottom protection film 3100 may be disconnected at the folding area FDA and disposed in the first non-folding area NFA1 and the second non-folding area NFA2 in order to facilitate the folding of the display device 10.

The digitizer layer 3300 may be disposed on the rear surface of the panel-bottom protection film 3100. The digitizer layer 3300 may include electrodes for sensing proximity or contact of an electronic stylus pen such as an active stylus pen supporting an electromagnetic resonance (EMR) technology. The electrodes may be implemented as a conductive pattern including a conductive material such as a metal. The conductive patterns of the digitizer layer 3300 may sense a magnetic field or an electromagnetic signal. For example, when an electronic stylus pen is placed on the front surface of the display device 10 and a magnetic field or an electromagnetic signal is generated through the electronic stylus pen, the generated magnetic field or electromagnetic signal may be input to the conductive patterns of the digitizer layer 3300. The digitizer layer 3300 may determine coordinates input by the electronic stylus pen by analyzing the magnitude of the magnetic field or electromagnetic signal input for each location.

The digitizer layer 3300 may be disconnected at the folding area FDA in order to facilitate folding of the display device 10. In such case, the digitizer layer 3300 may include a first digitizer layer 3310 disposed in the first non-folding area NFA1 and a second digitizer layer 3320 disposed in the second non-folding area NFA2. The distance between the first digitizer layer 3310 and the second digitizer layer 3320 in the second direction Y may be smaller than the width of the folding area FDA in the second direction Y. According to this structure, the display device 10 can be smoothly folded, while an area not detected by the electronic stylus pen in the folding area FDA can be reduced.

Although the digitizer layer 3300 overlaps with the non-display areas NDA1 and NDA2 at least partially in the example shown in FIG. 8, the present disclosure is not necessarily limited thereto. For example, the digitizer layer 3300 may overlap with the display area DA but not with the non-display area NDA.

Hereinafter, the structure of the digitizer layer 3300 will be described in more detail with reference to FIGS. 9 and 10. Hereinafter, only the structure of the first digitizer layer 3310 will be described for convenience of illustration. It is to be understood that the second digitizer layer 3320 may also have substantially the same structure.

Figure 9:
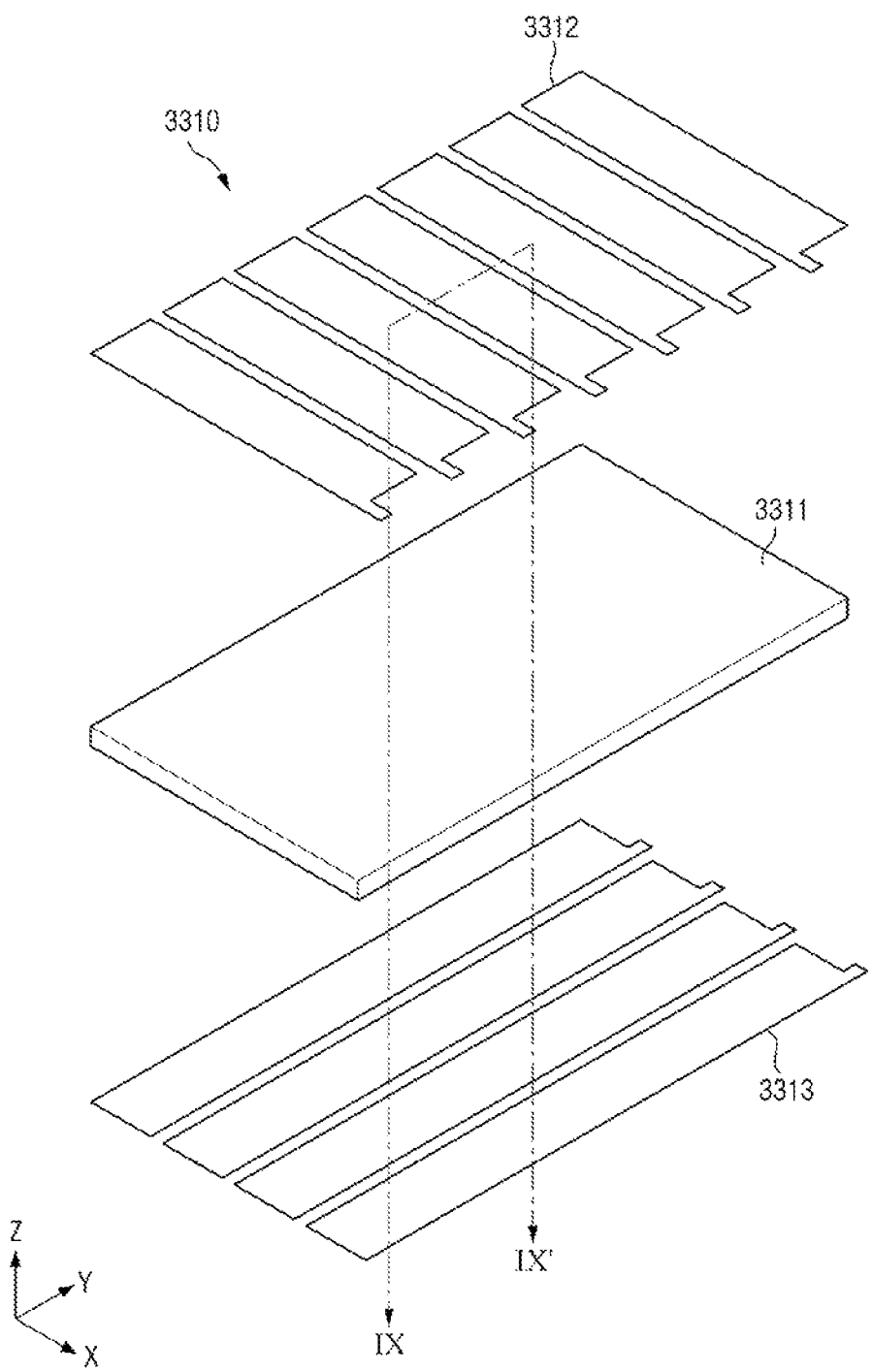
FIG. 9 is an exploded perspective view showing an example of the first digitizer layer of FIG. 7.

FIG. 9 is an exploded perspective view showing an example of the first digitizer layer of FIG. 7. FIG. 10 is a cross-sectional view showing an example of the first digitizer layer, taken along line IX-IX' of FIG. 9.

Figure 10:
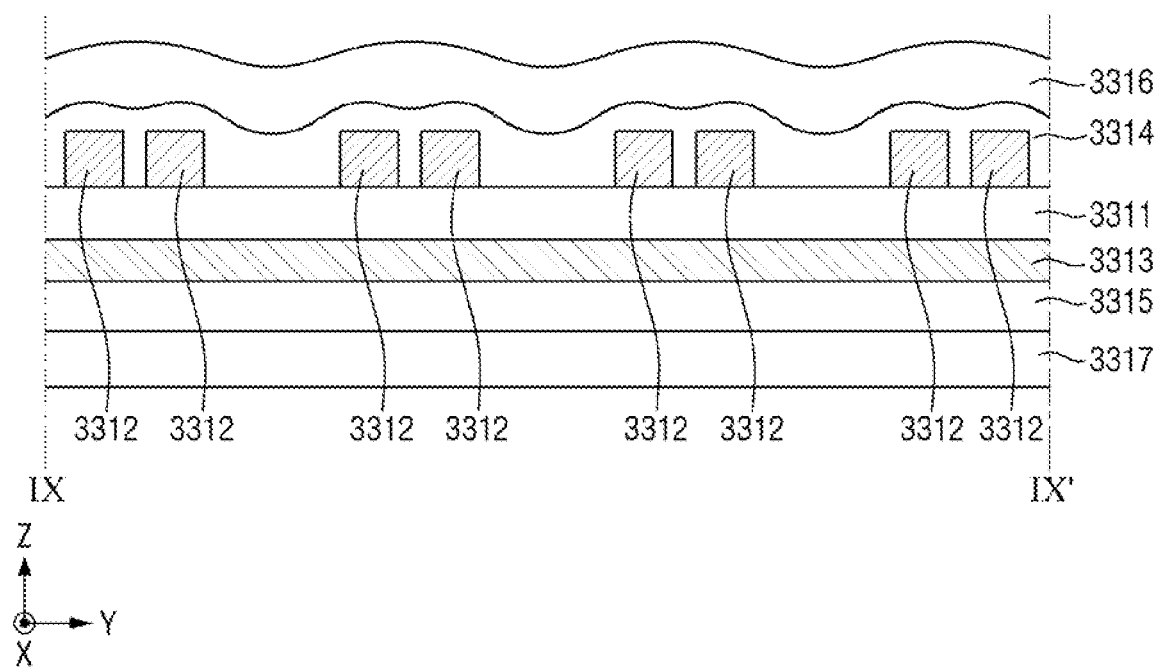
FIG. 10 is a cross-sectional view showing an example of the first digitizer layer, taken along line IX-IX' of FIG. 9.

As shown in FIGS. 9 and 10, the first digitizer layer 3310 may include a first base layer 3311, first conductive patterns 3312 disposed on the front surface of the first base layer 3311, a first adhesive layer 3314 disposed on the front surface of the first conductive patterns 3312, a first cover layer 3316 disposed on the front surface of the first adhesive layer 3314, second conductive patterns 3313 disposed on the rear surface of the first base layer 3311, a second adhesive layer 3315 disposed on the rear surface of the second conductive patterns 3313, and a second cover layer 3317 disposed on the rear surface of the second adhesive layer 3315.

The base layer 3311 serves as a substrate on which the first conductive patterns 3312 and the second conductive patterns 3313 are disposed. The base layer 3311 may include an insulating material. For example, the base layer 3311 may include, but is not necessarily limited to including, polyimide.

The first conductive patterns 3312 may be disposed on the front surface of the base layer 3311. Each of the first conductive patterns 3312 and the second conductive patterns

3313 may include a metal material such as copper (Cu), silver (Ag), nickel (Ni) and/or tungsten (W).

Each of the first conductive patterns 3312 may be extended in the first direction X. The plurality of first conductive patterns 3312 may be arranged in the second direction Y. Each of the first conductive patterns 3312 may have a shape of a closed loop structure (e.g., a rectangle) when viewed from the top.

The second conductive patterns 3313 may be disposed on the rear surface of the base layer 3311. Each of the second conductive patterns 3313 may be extended in the second direction Y. The plurality of second conductive patterns 3313 may be arranged in the first direction X. Each of the second conductive patterns 3313 may have a shape of a closed loop structure (e.g., a rectangle) when viewed from the top.

The first conductive patterns 3312 and the second conductive patterns 3313 may cross each other when viewed from the top. The magnetic field or electromagnetic signal output from the electronic stylus pen may be absorbed by the first conductive patterns 3312 and the second conductive patterns 3313. It is possible to determine which position of the first digitizer layer 3310 the electronic stylus pen is closest to based on the conductive patterns crossing one another.

In some embodiments, at least some of the first conductive patterns 3312 and the second conductive patterns 3313 may generate magnetic field upon receiving an input current, and the generated magnetic field or electromagnetic signal may be absorbed by the electronic stylus pen. The electronic stylus pen may output the absorbed magnetic field again, and the magnetic field output by the electronic stylus pen may be absorbed by the first conductive patterns 3312 and the second conductive patterns 3313. The first conductive patterns 3312 and the second conductive patterns 3313 may convert the magnetic field or the electromagnetic signal output from the electronic stylus pen into an electric signal.

When the first conductive patterns 3312 have a rectangular closed loop structure when viewed from the top, the distance between sides of a rectangle facing each other may be greater than the distance between adjacent rectangles. Accordingly, the density of the first conductive patterns 3312 may vary along the second direction Y. For example, the first conductive patterns 3312 may have a higher density between adjacent rectangles, while may have a lower density in one rectangle. The area where the first conductive pattern 3312 is disposed protrudes by the thickness of the first conductive pattern 3312 from the area where the first conductive pattern 3312 is not disposed, and thus level differences are formed on the surface.

The second conductive patterns 3313 also have an arrangement similar to that of the first conductive patterns 3312. For example, the distance between the sides of one rectangle that face each other is larger than the distance between adjacent rectangles, so that the density of the second conductive patterns 3313 may vary along the first direction X.

Although each of the first conductive patterns 3312 and the second conductive patterns 3313 has a rectangular loop structure when viewed from the top in the example shown in FIG. 9, embodiments of the present disclosure are not necessarily limited thereto. Each of the first conductive patterns 3312 and the second conductive patterns 3313 may have a variety of types of loop structures, including a circle, a polygon such as a pentagon and a hexagon, etc. when viewed from the top.

The first cover layer 3316 may be disposed over the first conductive patterns 3312. The first cover layer 3316 may include an insulating material. For example, the first cover layer 3316 may include polyimide. The first cover layer 3316 may have flexible properties. The first cover layer 3316 may be attached over the base layer 3311 and the first conductive patterns 3312 by the first adhesive layer 3314 including a pressure sensitive adhesive.

The second cover layer 3317 may be disposed on the second conductive patterns 3313. The second cover layer 3317 may include an insulating material having flexible properties. For example, the second cover layer 3317 may include polyimide. The second cover layer 3317 may have flexible properties. The second cover layer 3317 may be attached over the base layer 3311 and the second conductive patterns 3313 by the second adhesive layer 3315 including a pressure sensitive adhesive.

Each of the first cover layer 3316 and the second cover layer 3317 of the first digitizer layer 3310 has flexible characteristic, and thus they may reflect the level differences formed by the first conductive patterns 3312 and the second conductive patterns 3313.

For example, the level differences created by the first conductive patterns 3312 may be reflected on the front surface shape of the first adhesive layer 3314 thereon, which also affect the first cover layer 3316 having flexible characteristics, such that a first surface unevenness may be formed on the front surface of the first cover layer 3316. The first surface unevenness may generally reflect the surface level differences created by the first conductive patterns 3312, with the level differences somewhat reduced.

Likewise, the level differences created by the second conductive patterns 3313 may be reflected on the rear surface shape of the second adhesive layer 3315 thereunder, which also affect the second cover layer 3317 having flexible characteristics, such that a second surface unevenness may be formed on the rear surface of the second cover layer 3317.

The first surface unevenness and the second surface unevenness may affect the surface shapes of other elements attached thereto. For example, if an additional flexible film is attached to the front surface of the first digitizer layer 3310, the flexible film may also have surface unevenness affected by the first surface unevenness. If such surface unevenness is reflected up to the panel-bottom protection film 3100 close to the rear surface of the display panel 1000, the surface unevenness may be noticed by external light. To address such an issue, the support plate 3200 that blocks sequential transfer of the surface unevenness is interposed between the first digitizer layer 3310 and the panel-bottom protection film 3100. A detailed description thereof will be given later.

Referring back to FIGS. 7 and 8, the support plate 3200 may be disposed between the panel-bottom protection film 3100 and the digitizer layer 3300. The support plate 3200 may be attached on the rear surface of the panel-bottom protection film 3100 by a fifth adhesive layer AD5. The fifth adhesive layer AD5 may be a pressure sensitive adhesive. The fifth adhesive layer AD5 may be disconnected at the folding area FDA in order to facilitate the folding of the display device 10.

The support plate 3200 may be disposed on the rear surface of the panel-bottom protection film 3100 to support the display panel 1000 together with the panel-bottom protection film 3100 and can protect the rear surface of the display panel 1000. The support plate 3200 may be disposed on the front surface of the digitizer layer 3300 to support the digitizer layer 3300 and can protect the front surface of the digitizer layer 3300.

The support plate 3200 may be made of glass or ceramic having a relative permeability in the range of approximately 1.0 to 1 so that so that the magnetic field or electromagnetic signal transmitted from the front surface of the display device 10 or generated by the electrode patterns of the digitizer layer 3300 is not deformed. As used here, the term "relative permeability" $\mu_r$ is a ratio of magnetic permeability of a medium $\mu$ to the magnetic permeability of free space $\mu_0$, which is $4\pi \times 10^{-7}$ H/m. Thus, $\mu_r = \mu/\mu_0$. Materials such as glass and ceramic have a stronger hardness than polymer films such as polyimide. Therefore, even though the digitizer layer 3300 including the first surface unevenness is attached by pressing it on the rear surface of the support plate 3200, the support plate 3200 can resist so that its shape is not changed by the first surface unevenness of the digitizer layer 3300. For example, by employing the support plate 3200 having a flat front surface, the front surface of the support plate 3200 can maintain the flat shape even though the digitizer layer 3300 including the first surface unevenness is pressed on its rear surface. Therefore, irrespective of whether the digitizer layer 3300 has the first surface unevenness and how large the size of the first surface unevenness is, if any, the first surface unevenness are not transferred to the panel-bottom protection film 3100 disposed on the front surface of the digitizer layer 3300.

The width of the support plate 3200 in the second direction Y may be smaller than the width of the digitizer layer 3300 in the second direction Y. The digitizer layer 3300 may protrude in the second direction Y from the edge of the support plate 3200. According to this structure, even if an external force is applied to the side surface of the display device 10, the digitizer layer 3300 is impacted first, and thus it may help to prevent the support plate 3200, including glass or ceramic, from being broken.

The thickness of the support plate 3200 may be larger than the thickness of the digitizer layer 3300. If the thickness of the support plate 3200 is larger than the thickness of the digitizer layer 3300, it may be helpful in preventing the transfer of the first surface unevenness on the front surface of the digitizer layer 3300 to the support plate 3200. It is, however, to be understood that embodiments of the present disclosure are not necessarily limited thereto.

Figure 11:
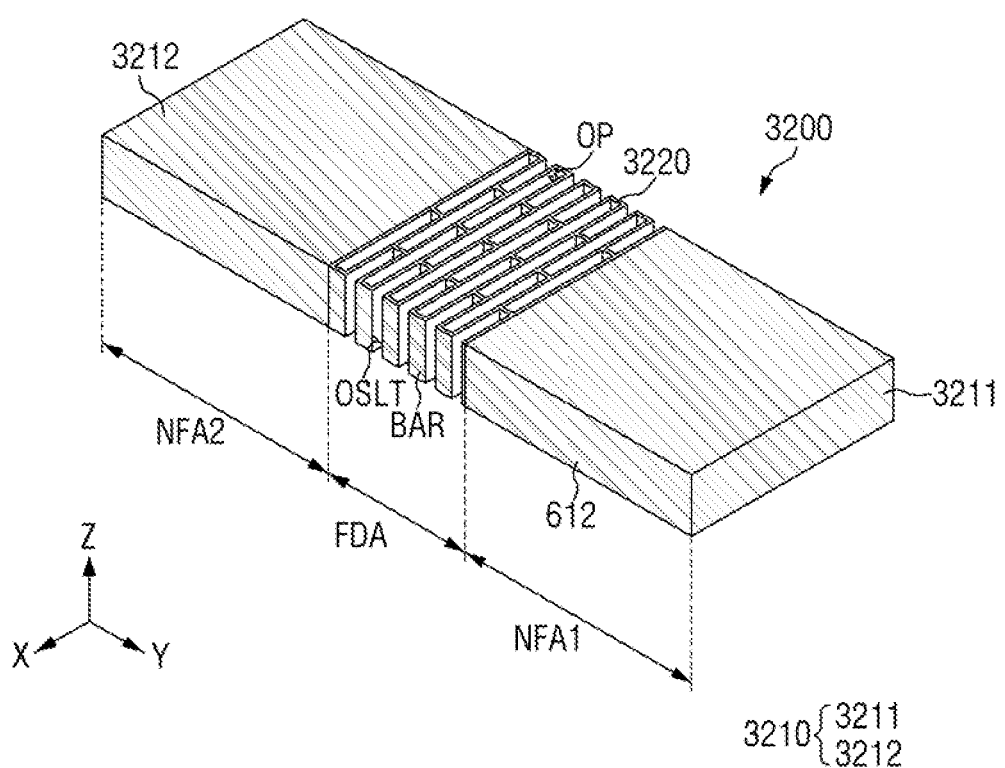
FIG. 11 is a perspective view showing an example of the support plate of FIG. 8.
Figure 12:
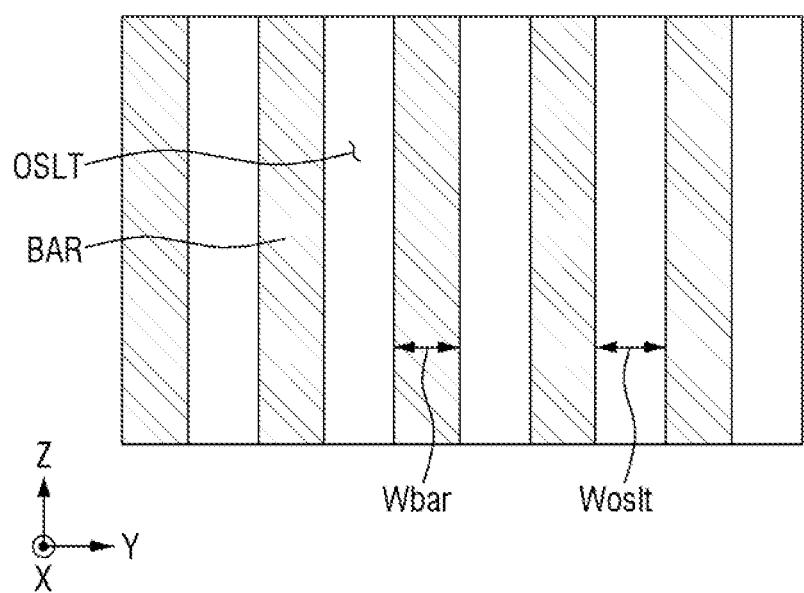
FIG. 12 is a side view of the folding area of the support plate of FIG. 11.
Figure 13:
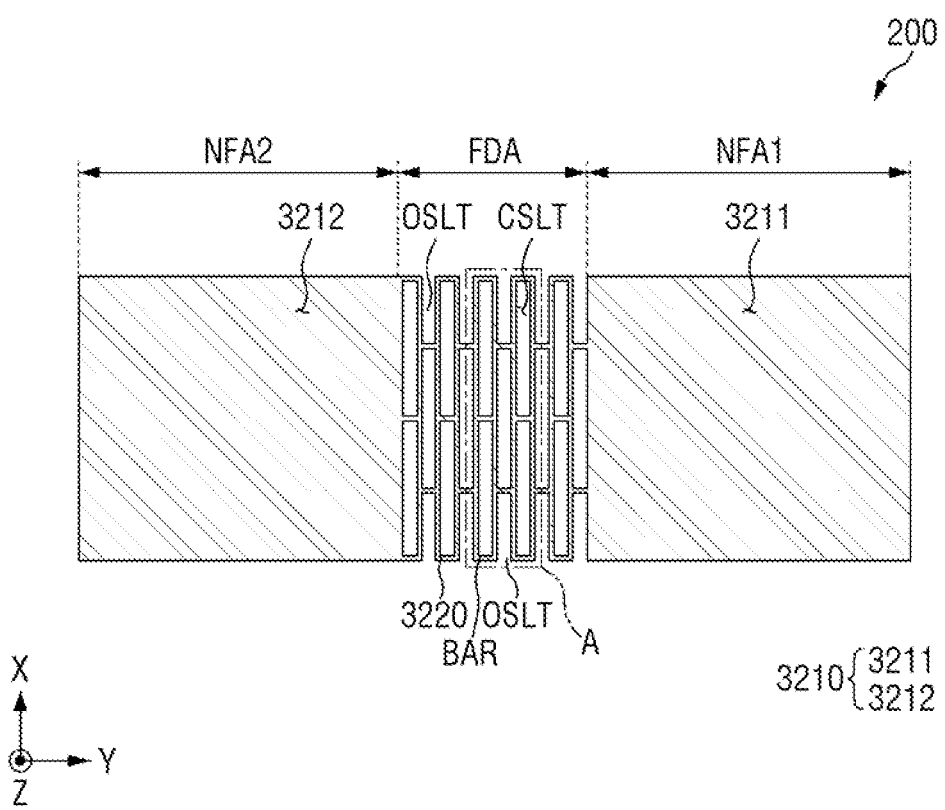
FIG. 13 is a plan view of the support plate of FIG. 11.
Figure 14:
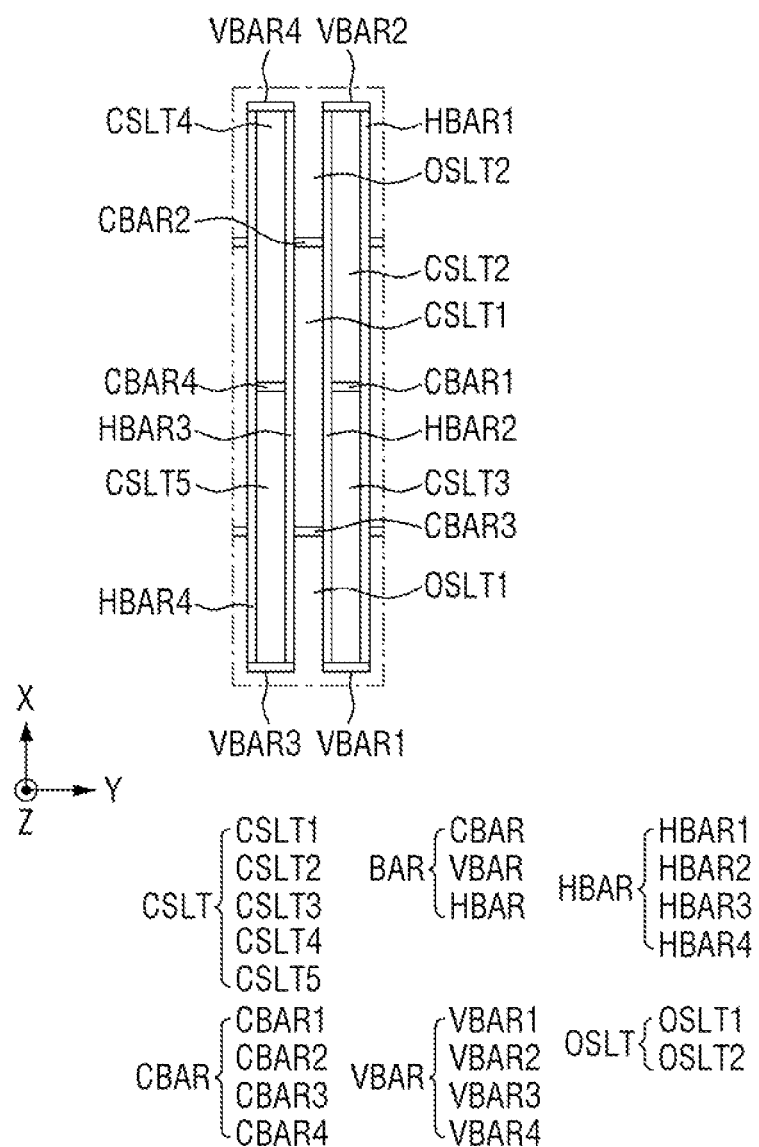
FIG. 14 is an enlarged view of area A of FIG. 13.

FIG. 11 is a perspective view showing an example of the support plate of FIG. 8. FIG. 12 is a side view of a folding area of the support plate of FIG. 11. FIG. 13 is a plan view of the support plate of FIG. 11. FIG. 14 is an enlarged view of area A of FIG. 13.

Referring to FIG. 11, the support plate 3200 may include flat portions 3210 disposed in the non-folding areas NFA1 and NFA2, and a pattern portion 3220 disposed in the folding area FDA. The pattern portion 3220 may include one or more openings OP. The flat portions 3210 may include a first flat portion 3211 disposed in the first non-folding area NFA1 and a second flat portion 3212 disposed in the second non-folding area NFA2. The first flat portion 3211, the pattern portion 3220 and the second flat portion 3212 of the support plate 3200 may be integrally formed. For example, the first flat portion 3211 and the second flat portion 3212 may be connected by a plurality of bars BAR of the pattern portion 3220 and may be integrally formed.

More specifically, the front and rear surfaces of the first flat portion 3211 and the second flat portion 3212 may be flat. It is, however, to be understood that the present disclosure is not necessarily limited thereto. For example, the front surfaces of the first flat portion 3211 and the second flat portion 3212 may be flat, while the rear surfaces might not be flat. In such case, the rear surface of each of the first flat portion 3211 and the second flat portion 3212 may include an uneven surface for covering the level differences on the front surface of the digitizer layer 3300.

The first flat portion 3211 may be disposed in the first non-folding area NFA1. The width of the first flat portion 3211 in the second direction Y may be substantially equal to the width of the first non-folding area NFA1. In such case, one side surface of the first flat portion 3211 may be disposed on the first folding line FL1. It is, however, to be understood that the present disclosure is not necessarily limited thereto. For example, the width of the first flat portion 3211 in the second direction Y may be shorter than the width of the first non-folding area NFA1.

The second flat portion 3212 may be disposed in the second non-folding area NFA2. The width of the second flat portion 3212 in the second direction Y may be substantially equal to the width of the second non-folding area NFA2. In such case, one side surface of the second flat portion 3212 may be disposed on the second folding line FL2. It is, however, to be understood that the present disclosure is not necessarily limited thereto. For example, the width of the second flat portion 3212 in the second direction Y may be shorter than the width of the second non-folding area NFA2.

The pattern portion 3220 may be disposed in the folding area FDA. The width of the pattern portion 3220 in the second direction Y may be substantially equal to the width of the folding area FDA. In such case, one side surface of the pattern portion 3220 may be disposed on the first folding line FL1, and the opposite side surface of the pattern portion 3220 may be disposed on the second folding line FL2. It is, however, to be understood that the present disclosure is not necessarily limited thereto. For example, the width of the pattern portion 3220 in the second direction Y may be smaller than the width of the folding area FDA, and one side surface and the opposite side surface of the pattern portion 3220 may be disposed in the folding area FDA.

The pattern portion 3220 may overlap the folding area FDA. The pattern portion 3220 may include a plurality of openings OP to reduce the folding stress of the display device 10. Accordingly, the density of the support plate 3200 in the folding area FDA may be smaller than the density of the support plate 3200 in the first non-folding area NFA1 and the second non-folding area NFA2.

Although the pattern portion 3220 is integrally formed, it is defined as including a plurality of bars BAR in the following description for convenience of illustration. The plurality of bars BAR may be separated from one another by the openings OP disposed adjacent to one another.

The openings OP may include closed slits CSLT and open slits OSLT. The closed slits CSLT refer to the openings OP that are entirely surrounded by the bars BAR, and the open slits OSLT refer to the openings OP that are partially surrounded by the bars BAR and have at least a side open to the outside. The open slits OSLT may have a bay shape curved inward from one side of the support plate 3200 when viewed from the top.

Each of the closed slits CSLT and the open slits OSLT may have a rectangular shape when viewed from the top. In such case, the width of the rectangular shape in the first direction X may be larger than the width of the rectangular shape in the second direction Y. For example, the width of each of the closed slits CSLT and the open slits OSLT in the first direction X may be less than ⅔ the width of the folding area FDA in the first direction X. According to this structure, the support plate 3200 can reduce folding stress at the folding area FDA, and the display device 10 can be bent smoothly. It is, however, to be understood that this is merely illustrative. For example, the closed slits CSLT may have a diamond shape in which the width of the diagonal line parallel to the first direction X is longer than the width of the diagonal line parallel to the second direction Y, and the open slits OSLT may have a triangular shape.

Herein, the thickness of each of the plurality of openings OP is equal to the thickness of the flat portions 3210 of the support plate 3200, for example. It is, however, to be understood that the present disclosure is not necessarily limited thereto. For example, the thickness of each of the plurality of openings OP may be smaller than the thickness of the flat portions 3210 of the support plate 3200.

The plurality of closed slits CSLT may be defined by the plurality of bars BAR and the plurality of open slits OSLT. Hereinafter, a plurality of bars BAR, a plurality of closed slits CSLT and a plurality of open slits OSLT will be described with reference to FIGS. 12 to 14.

FIG. 12 is a side view of the folding area of the support plate of FIG. 11. FIG. 13 is a plan view of the support plate of FIG. 11. FIG. 14 is an enlarged view of area A of FIG. 13.

Referring to FIGS. 12 and 13, the plurality of bars BAR may be extended in the first direction X. The plurality of bars BAR may be arranged in the second direction Y. The open slits OSLT may be disposed between adjacent ones of the plurality of bars BAR.

The thickness of each of the plurality of bars BAR may be substantially equal to the thickness of the flat portions 3210, but the present disclosure is not necessarily limited thereto. For example, the thickness of each of the plurality of bars BAR may be smaller than the thickness of the flat portions 3210. In such case, the support plate 3200 may have a bay shape in which the rear surface is curved inward in the third direction DR3 at the folding area FDA.

If the width Wbar of the plurality of bars BAR is larger than the width Woslt of the open slits OSLT, the display device 10 might not be easily bent at the folding area FDA. Therefore, the width Wbar of the bars BAR may be smaller than or substantially equal to the width Woslt of the open slits OSLT.

Referring to FIG. 14, the plurality of bars BAR may include a plurality of horizontal bars HBAR, a plurality of vertical bars VBAR, and a plurality of connection bars CBAR. Hereinafter, an arrangement and connection relationship of a plurality of bars BAR will be described.

The plurality of horizontal bars HBAR may include a first horizontal bar HBAR1, a second horizontal bar HBAR2, a third horizontal bar HBAR3, and a fourth horizontal bar HBAR4. The first horizontal bar HBAR1, the second horizontal bar HBAR2, the third horizontal bar HBAR3 and the fourth horizontal bar HBAR4 may be extended in the first direction X and may be arranged in the second direction Y. For example, as shown in FIG. 13, the second horizontal bar HBAR2 may be disposed on one side of the first horizontal bar HBAR1, the third horizontal bar HBAR3 may be disposed on one side of the second horizontal bar HBAR2, and the fourth horizontal bar HBAR4 may be disposed on one side of the third horizontal bar HBAR3.

The plurality of vertical bars VBAR may include a first vertical bar VBAR1, a second vertical bar VBAR2, a third vertical bar VBAR3, and a fourth vertical bar VBAR4. The first vertical bar VBAR1, the second vertical bar VBAR2, the third vertical bar VBAR3 and the fourth vertical bar VBAR4 may be extended in the second direction Y.

The first vertical bar VBAR1 may be disposed between one end of the first horizontal bar HBAR1 and one end of the second horizontal bar HBAR2. The end of the first horizontal bar HBAR1 and the end of the second horizontal bar HBAR2 may be connected by the first vertical bar VBAR1.

The second vertical bar VBAR2 may be disposed between the other end of the first horizontal bar HBAR1 and the other end of the second horizontal bar HBAR2. The other end of the first horizontal bar HBAR1 and the other end of the second horizontal bar HBAR2 may be connected by the second vertical bar VBAR2.

The third vertical bar VBAR3 may be disposed between one end of the third horizontal bar HBAR3 and one end of the fourth horizontal bar HBAR4. The end of the third horizontal bar HBAR3 and the end of the fourth horizontal bar HBAR4 may be connected by the third vertical bar VBAR3.

The fourth vertical bar VBAR4 may be disposed between the other end of the third horizontal bar HBAR3 and the other end of the fourth horizontal bar HBAR4. The other end of the third horizontal bar HBAR3 and the other end of the fourth horizontal bar HBAR4 may be connected by the fourth vertical bar VBAR4.

The plurality of connection bars CBAR may include a first connection bar CBAR1, a second connection bar CBAR2, a third connection bar CBAR3, and a fourth connection bar CBAR4. The first connection bar CBAR1, the second connection bar CBAR2, the third connection bar CBAR3 and the fourth connection bar CBAR4 may be extended in the second direction Y.

The first connection bar CBAR1 may be disposed between the first horizontal bar HBAR1 and the second horizontal bar HBAR2. The first horizontal bar HBAR1 and the second horizontal bar HBAR2 may be connected by the first connection bar CBAR1. The first connection bar CBAR1 may be disposed between the first vertical bar VBAR1 and the second vertical bar VBAR2 in the first direction X.

Each of the second connection bar CBAR2 and the third connection bar CBAR3 may be disposed between the second horizontal bar HBAR2 and the third horizontal bar HBAR3. The second horizontal bar HBAR2 and the third horizontal bar HBAR3 may be connected by the second connection bar CBAR2. The second horizontal bar HBAR2 and the third horizontal bar HBAR3 may be connected by the third connection bar CBAR3. The second connection bar CBAR2 and the third connection bar CBAR3 may overlap in the first direction X.

The fourth connection bar CBAR4 may be disposed between the third horizontal bar HBAR3 and the fourth horizontal bar HBAR4. The third horizontal bar HBAR3 and the fourth horizontal bar HBAR4 may be connected by the fourth connection bar CBAR4. The fourth connection bar CBAR4 may be disposed between the third vertical bar VBAR3 and the fourth vertical bar VBAR4 in the first direction X.

The plurality of open slits OSLT may include first open slits OSLT1 and second open slits OSLT2.

Each of the first open slits OSLT1 may be defined as an opening OP surrounded by the second horizontal bar HBAR2, the third horizontal bar HBAR3 and the third connection bar CBAR3. Each of the second open slits OSLT2 may be defined as an opening OP surrounded by the second horizontal bar HBAR2, the third horizontal bar HBAR3 and the second connection bar CBAR2. The first open slits OSLT1 and the second open slits OSLT2 may overlap each other in the first direction X.

The plurality of closed slits CSLT may include first closed slits CSLT1, second closed slits CSLT2, third closed slits CSLT3, fourth closed slits CSLT4, and fifth closed slits CSLT5.

Each of the first closed slits CSLT1 may be defined as an opening OP surrounded by the second connection bar CBAR2, the third connection bar CBAR3, the second horizontal bar HBAR2 and the third horizontal bar HBAR3. Each of the second closed slits CSLT2 may be defined as an opening OP surrounded by the first horizontal bar HBAR1, the second horizontal bar HBAR2, the second vertical bar VBAR2 and the first connection bar CBAR1. Each of the third closed slits CSLT3 may be defined as an opening OP surrounded by the first horizontal bar HBAR1, the second horizontal bar HBAR2, the first vertical bar VBAR1 and the first connection bar CBAR1. Each of the fourth closed slits CSLT4 may be defined as an opening OP surrounded by the third horizontal bar HBAR3, the fourth horizontal bar HBAR4, the fourth vertical bar VBAR4 and the fourth connection bar CBAR4. Each of the fifth closed slits CSLT5 may be defined as an opening OP surrounded by the third horizontal bar HBAR3, the fourth horizontal bar HBAR4, the third vertical bar VBAR3 and the fourth connection bar CBAR4.

As such, the pattern portion 3220 includes a grid pattern formed by the plurality of bars BAR, the plurality of closed slits CSLT and the plurality of open slits OSLT, so that the display device 10 can be smoothly folded in the folding area FDA. In addition, as the support plate 3200 includes the plurality of bars BAR connected to one another in the folding area FDA, and the first flat portion 3211, the pattern portion 3220 and the second flat portion 3212 are integrally formed, the support plate 3200 can remain aligned as the display device 10 is in an unfolded state even when the display device 10 is in an unfolded state, and can stably support the display panel 1000 and the digitizer layer 3300.

Referring back to FIGS. 7 and 8, the buffer layer 3400 may be disposed between the support plate 3200 and the digitizer layer 3300. The buffer layer 3400 may be attached to the rear surface of the support plate 3200 by a sixth adhesive layer AD6, and may be attached to the front surface of the digitizer layer 3300 by a seventh adhesive layer AD7.

Each of the sixth adhesive layer AD6 and the seventh adhesive layer AD7 may be disconnected at the folding area FDA so that the display device 10 is smoothly folded. The sixth adhesive layer AD6 and the seventh adhesive layer AD7 may be pressure sensitive adhesives.

The buffer layer 3400 can absorb external impact to prevent damage to the support plate 3200 and the digitizer layer 3300. In addition, the buffer layer 3400 can prevent particles such as dust from flowing into the pattern portion 3220 of the support plate 3200 from the rear surface of the display device 10.

For example, the buffer layer 3400 may include an elastic material such as a rubber and a sponge formed by foaming a urethane-based material or an acrylic-based material. Since the buffer layer 3400 has elasticity, it may have a thickness of approximately 10 μm or less in order to facilitate the folding of the display device 10. Accordingly, the front surface of the buffer layer 3400 may have a shape in which the first surface unevenness of the front surface of the digitizer layer 3300 are somewhat reduced. Accordingly, when the buffer layer 3400 is attached to the front surface of the digitizer layer 3300, the front surface of the buffer layer 3400 may include a third surface unevenness reflecting the first surface unevenness of the digitizer layer 3300.

The shielding layer 3500 may be disposed on the rear surface of the digitizer layer 3300. The shielding layer 3500 may include magnetic metal powder (MMP), so that a magnetic field or an electromagnetic signal that has passed through the digitizer layer 3300 may flow into the shielding layer 3500. Therefore, the shielding layer 3500 can reduce the emission of a magnetic field or an electromagnetic signal to the rear surface of the display device 10.

The shielding layer 3500 may be disconnected at the folding area FDA in order to facilitate the folding of the display device 10. In such case, the shielding layer 3500 may include a first shielding layer 3510 disposed in the first non-folding area NFA1 and a second shielding layer 3520 disposed in the second non-folding area NFA2. The width of the first shielding layer 3510 in the second direction Y may be substantially equal to the width of the first digitizer layer 3310 in the second direction Y, and the width of the second shielding layer 3520 in the second direction Y may be substantially equal to the width of the second digitizer layer 3320 in the second direction Y. The distance between the first shielding layer 3510 and the second shielding layer 3520 in the second direction Y may be smaller than the width of the folding area FDA. According to this structure, while the display device 10 can be smoothly folded in the folding area FDA, it may be helpful in reducing the emission of a magnetic field or an electric signal to the rear surface of the display device 10.

The heat dissipation layer 3600 is disposed on the shielding layer 3500. The heat dissipation layer 3600 may be a metal film such as a copper alloy, copper, nickel, ferrite and silver having excellent thermal conductivity. Accordingly, heat generated in the display device 10 can be released to the outside by the heat dissipation layer 3600.

The heat dissipation layer 3600 may be disconnected at the folding area FDA in order to facilitate the folding of the display device 10. In such case, the heat dissipation layer 3600 may include a first heat dissipation layer 3610 disposed in the first non-folding area NFA1 and a second heat dissipation layer 3620 disposed in the second non-folding area NFA2. The distance between the first heat dissipation layer 3610 and the second heat dissipation layer 3620 in the second direction Y may be smaller than the width of the folding area FDA. According to this structure, the display device 10 can be smoothly folded in the folding area FDA and the area of the heat dissipation layer 3600 can be increased, so that it may be helpful in releasing heat generated in the display device 10.

As shown in FIGS. 7 and 8, in the display device 10, according to the embodiment of the present disclosure, the support plate 3200 including a hard material that does not change easily by external pressure is disposed on the digitizer layer 3300, so that the support plate 3200 can block sequential transfer of the surface unevenness even if there is surface unevenness formed by the conductive patterns on the front surface of the digitizer layer 3300. Therefore, irrespective of whether the digitizer layer 3300 has the first surface unevenness and how large the size of the first surface unevenness is, if any, the surface unevenness is not transferred to the panel-bottom protection film 3100 disposed on the front surface of the digitizer layer 3300. In addition, since the support plate 3200 includes the plurality of openings OP in the folding area FDA, the display device 10 can be folded smoothly.

Figure 15:
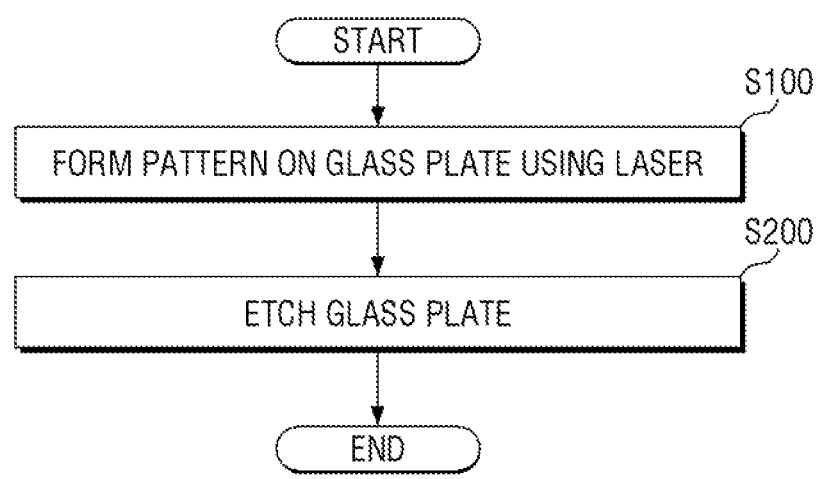
FIG. 15 is a flowchart illustrating an example of a method of fabricating the support plate of FIG. 11.
Figure 16:
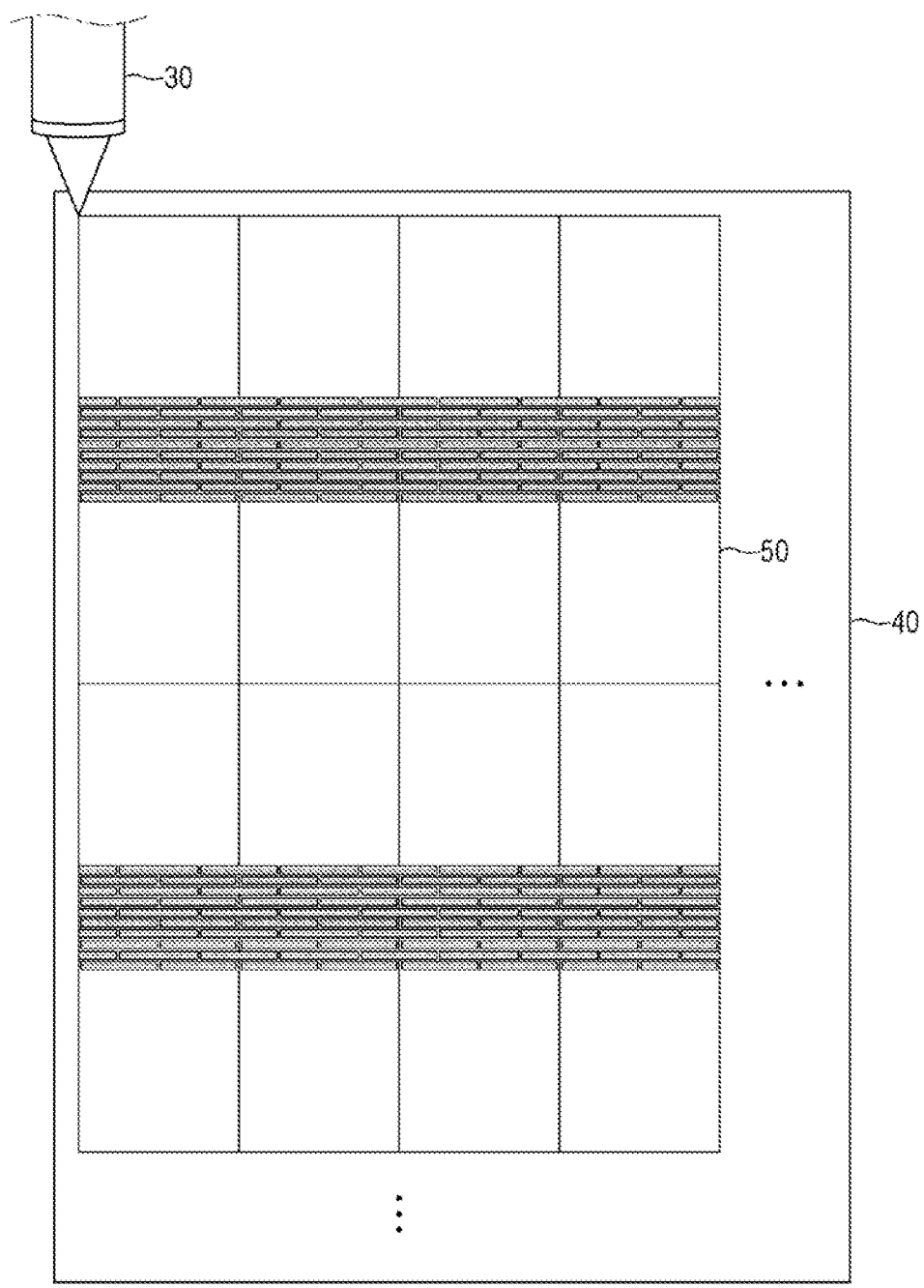
FIG. 16 is a plan view showing the process of forming a pattern on a glass plate using a laser of FIG. 15.

FIG. 15 is a flowchart illustrating an example of a method of fabricating the support plate of FIG. 11. FIG. 16 is a plan view showing the process of forming a pattern on a glass plate using a laser of FIG. 15.

Referring first to FIG. 15, a pattern is formed on a glass plate using a laser (step S100).

When a laser 30 is directed onto some regions of a glass plate 40, the etch rate of the regions 50 exposed by the laser 30 may be increased compared to the other regions not exposed the laser 30. For example, the etch rate of the regions 50 exposed by the laser 30 may be approximately ten times higher than the etch rate of the regions not exposed by the laser 30.

The laser 30 may be a Bessel beam laser, and a picosecond infrared laser may be applied. The energy of the Bessel beam may be 16 µJ, and the pulse repetition rate may be 30 kHz. It is, however, to be understood that the present disclosure is not necessarily limited thereto. For example, the Bessel beam laser may be a nanosecond UV laser.

Subsequently, the glass plate 40 is etched (step S200).

The etching may be carried out by wet etching in which the glass plate 40 is etched through chemical reaction using an etching solution. The etching solution may include at least one of hydrofluoric acid (HF) and a hydrofluoric acid-based diluted etching solution.

When an etching process is carried out on the glass plate 40, the etch rate of the regions 50 exposed by the laser 30 is higher than that of the other regions, and thus the regions 50 may be selectively etched and removed. As a result, the openings OP having the same shape as the pattern exposed by the laser 30 may be formed. In this manner, the support plate 3200 including the above-described various shapes of the openings OP can be fabricated.

Although a method of forming the pattern by the laser 30 and using wet etching is illustrated in the example shown in FIG. 15, the present disclosure is not necessarily limited thereto. For example, the support plate 3200 may be fabricated by cutting the glass plate 40 using the laser 30. It is to be noted that the glass plate 40 may have a tapered shape, i.e., the width of the front surface may be different from the width of the rear surface where the glass plate 40 is cut using the laser 30.

In contrast, when the support plate 3200 is fabricated by forming the pattern by the Bessel beam laser and then using wet etching, a plurality of support plates 3200 including substantially the same pattern as shown in FIG. 16 can be fabricated simultaneously. Accordingly, it is appropriate for mass production, and it may be helpful in making the uniform widths of the front and rear surfaces of the pattern.

Figure 17:
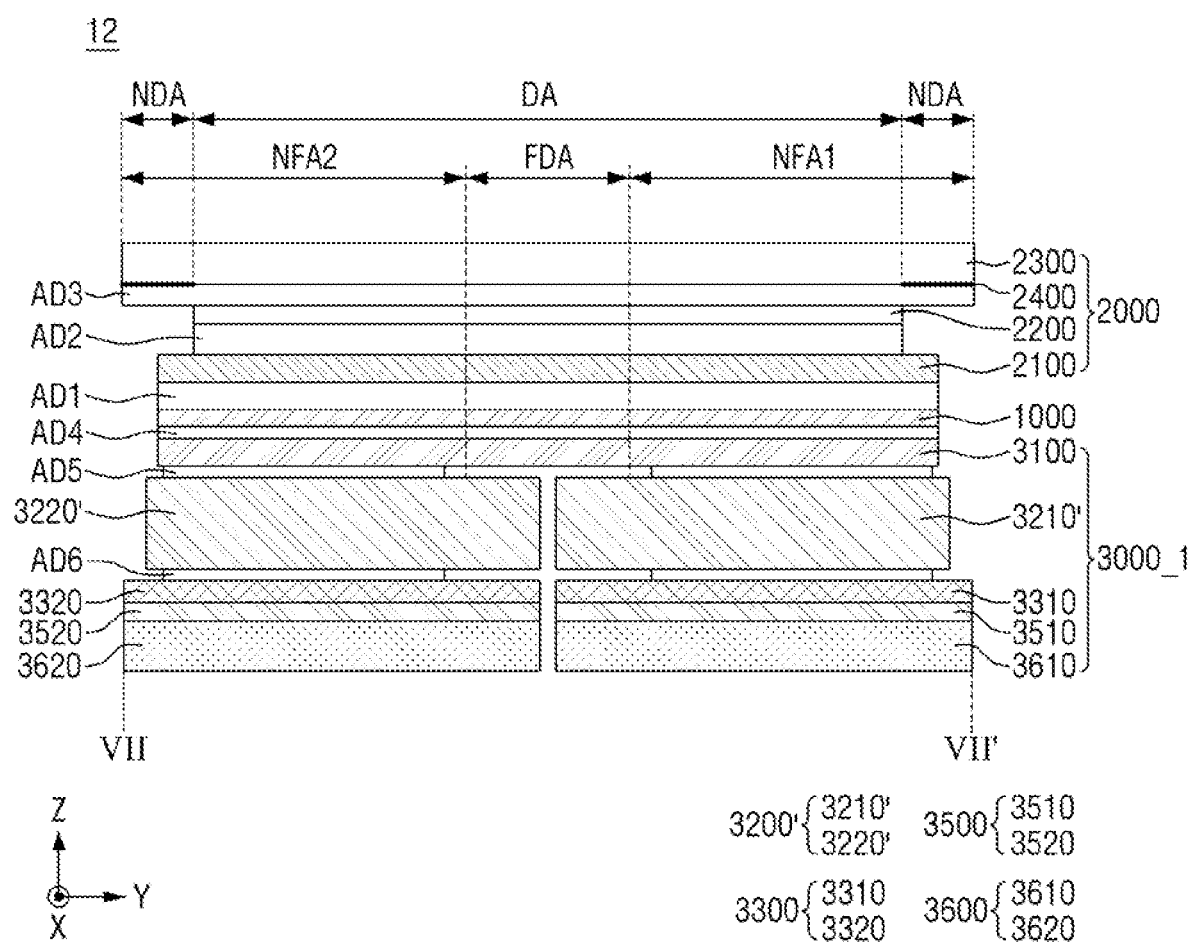
FIG. 17 is a cross-sectional view of a display device according to an embodiment of the present disclosure.

FIG. 17 is a cross-sectional view of a display device according to an embodiment of the present disclosure.

The arrangement of FIG. 17 is different from the arrangement of FIG. 7 in that a support plate 3200' is disconnected at the folding area. Description will focus on the difference and it is to be understood that elements not described here are at least similar to corresponding elements that have been described elsewhere in the instant disclosure.

The support plate 3200' may be disconnected at the folding area FDA in order to facilitate the folding of the display device. The support plate 3200' may include a first support plate 3210' and a second support plate 3220'. The first support plate 3210' may be disposed in the first non-folding area NFA1, and the second support plate 3220' may be disposed in the second non-folding area NFA2. The distance between the first support plate 3210' and the second support plate 3220' in the second direction Y may be smaller than the width of the folding area FDA in the second direction Y. Accordingly, the area in which the support plate 3200 is not disposed in the folding area FDA is reduced, so that the display panel 1000 and the digitizer layer 3300 can be stably supported.

The width of the first support plate 3210' in the second direction Y may be smaller than the width of the first digitizer layer 3310 in the second direction Y. In this instance, one side surface of the first support plate 3210' and one side surface of the first digitizer layer 3310 overlap each other at the folding area FDA, and the opposite side surface of the first support plate 3210' and the opposite side surface of the first digitizer layer 3310 might not overlap each other. For example, the first digitizer layer 3310 may have a shape protruding in the second direction Y from the first support plate 3210'. It is, however, to be understood that the present disclosure is not necessarily limited thereto. For example, the width of the first support plate 3210' in the second direction Y may be substantially equal to the width of the first digitizer layer 3310 in the second direction Y.

The width of the second support plate 3220' in the second direction Y may be smaller than the width of the second digitizer layer 3320 in the second direction Y. In this instance, one side surface of the second support plate 3220' and one side surface of the second digitizer layer 3320 overlap each other at the folding area FDA, and the opposite side surface of the second support plate 3220' and the opposite side surface of the second digitizer layer 3320 might not overlap each other. For example, the second digitizer layer 3320 may have a shape protruding in the second direction Y from the second support plate 3220'. It is, however, to be understood that the present disclosure is not necessarily limited thereto. For example, the width of the second support plate 3220' in the second direction Y may be substantially equal to the width of the second digitizer layer 3320 in the second direction Y.

When the width of the support plate 3200' in the second direction Y is larger than the width of the digitizer layer 3300 in the second direction Y, the digitizer layer 3300 receives an impact first when an external force is applied to the side surface of the display device 12, so that it may be helpful in preventing the support plate 3200' including glass, ceramic etc. from being broken.

Figure 18:
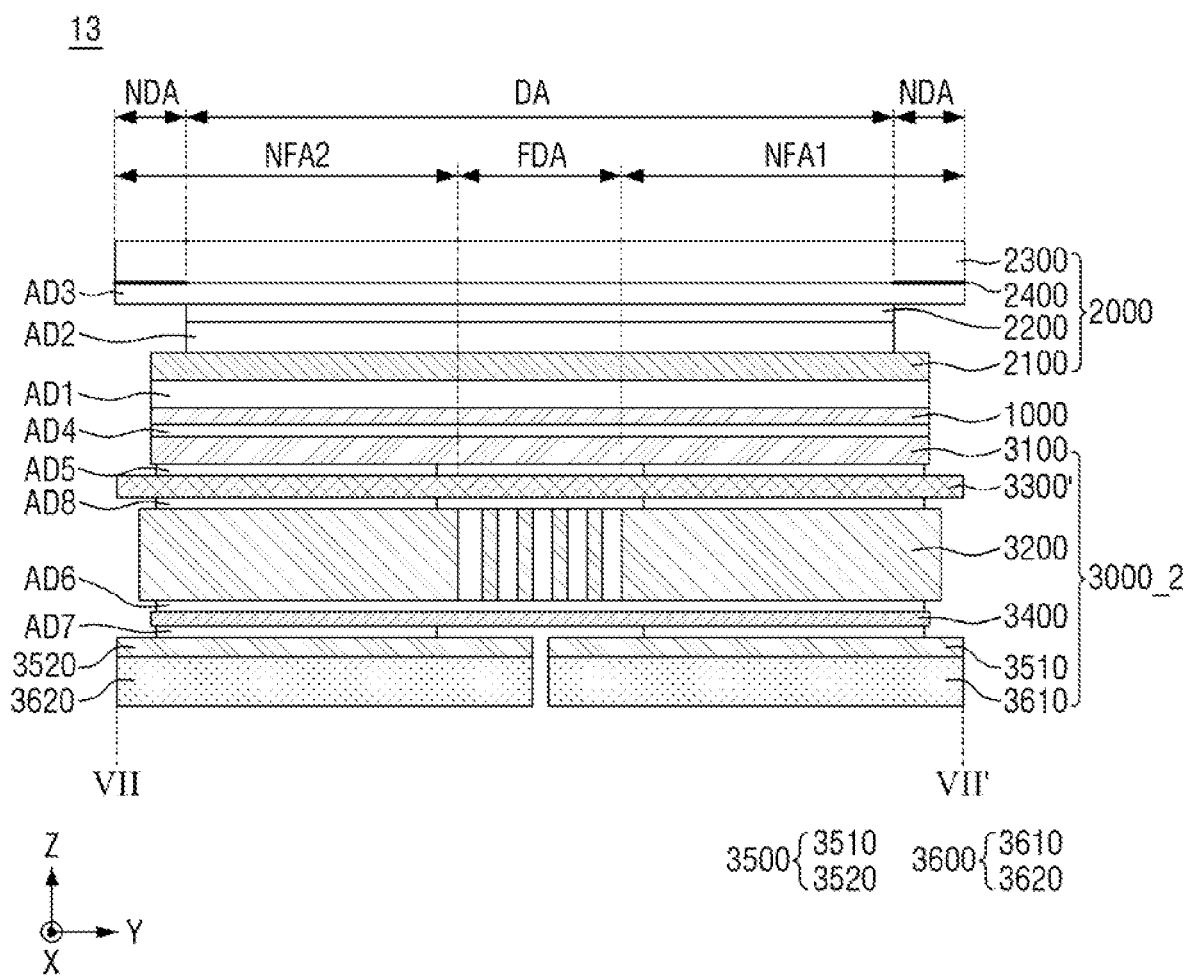
FIG. 18 is a cross-sectional view of a display device according to an embodiment of the present disclosure.

FIG. 18 is a cross-sectional view of a display device according to an embodiment of the present disclosure.

The embodiment of FIG. 18 is different from the embodiment of FIG. 7 in that a digitizer layer 3300' is integrally formed and is disposed between the panel-bottom protection film 3100 and the support plate 3200, and that a rear-side layer having an uneven front surface is a shielding layer 3500. Description will focus on the differences and it is to be understood that elements not described here are at least similar to corresponding elements that have been described elsewhere in the instant disclosure.

The digitizer layer 3300' may be integrally formed and disposed in the first non-folding area NFA1, the second non-folding area NFA2 and the folding area FDA. Accordingly, it is possible to recognize a touch using a stylus pen also in the folding area FDA.

The shielding layer 3500 includes magnetic metal powder (MMP) and thus it has the front surface having surface unevenness including regular pits and/or bumps, like an orange peel. Accordingly, it may be the rear-side layer having surface unevenness.

The support plate 3200 may be disposed between the digitizer layer 3300' and the shielding layer 3500. Accordingly, the surface level differences transferred to the panel-bottom protection film 3100 can be reduced compared to the structure in which the shielding layer 3500 is disposed on the rear surface of the digitizer layer 3300' and the digitizer layer 3300' is disposed on the rear surface of the panel-bottom protection film 3100, i.e., the support plate 3200 is not disposed.

According to the embodiment of FIG. 18, it is possible to prevent the surface unevenness of the shielding layer 3500 from being transferred to the front surface of the display device, and to recognize the pen is recognized by the digitizer layer 3300' even in the folding area FDA.

Figure 19:
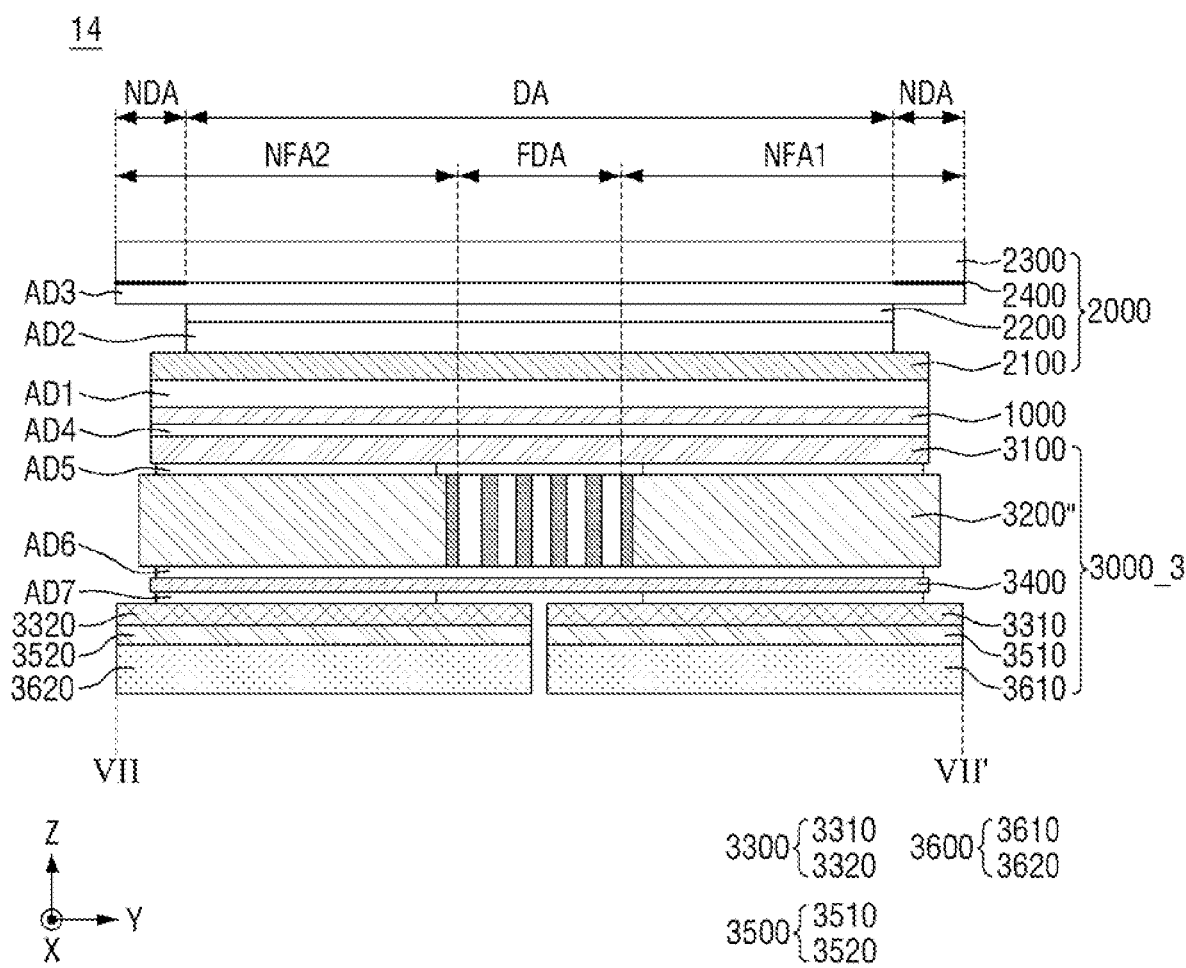
FIG. 19 is a cross-sectional view of a display device according to an embodiment of the present disclosure.
Figure 20:
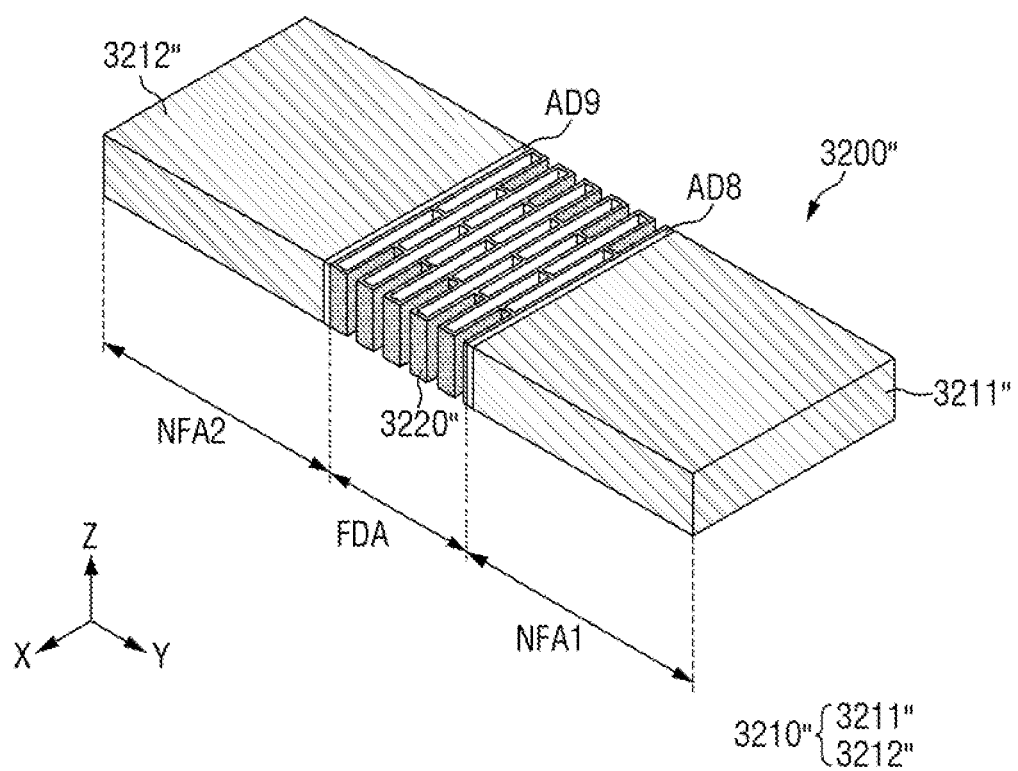
FIG. 20 is a perspective view of the support plate of FIG. 19.

FIG. 19 is a cross-sectional view of a display device according to an embodiment of the present disclosure. FIG. 20 is a perspective view of the support plate of FIG. 19.

The embodiment of FIGS. 19 and 20 is different from the embodiment of FIG. 7 in that a flat portion 3210" of a support plate 3200" is made of glass while a pattern portion 3220" is made of ceramic. Description will focus on the differences and it is to be understood that elements not described here are at least similar to corresponding elements that have been described elsewhere in the instant disclosure.

In forming a plurality of openings OP" in the pattern portion 3220" of the support plate 3200", it is more helpful to process the pattern portion 3220" made of ceramic than the pattern portion 3220" made of glass.

In this instance, the pattern portion 3220" and the flat portions 3210" of the support plate 3200" are not formed integrally, and thus adhesive layers AD8 and AD9 to attach the pattern portion 3220" with the flat portions 3210" may be further included. The adhesive layers AD8 and AD9 may be pressure sensitive adhesives.

Although embodiments of the present invention have been disclosed for illustrative purposes, those skilled in the art will appreciate that various modifications, additions and substitutions are possible, without departing from the scope and spirit of the present disclosure.

What is claimed is:

1. A display device, comprising:
   a display panel having a front surface displaying an image and a rear surface opposite to the front surface;
   a digitizer disposed on the rear surface of the display panel, the digitizer comprising a plurality of conductive patterns and having first surface unevenness on a front surface thereof, the front surface facing the display panel;
   a support plate disposed between the display panel and the digitizer and having a flat front surface that faces the display panel; and
   a buffer layer disposed between the support plate and the front surface of the digitizer,
   wherein the buffer layer has a shape that reduces the surface unevenness of the front surface of the digitizer, and
   wherein the support plate comprises glass or ceramic.

2. The display device of claim 1, wherein at least some of the plurality of conductive patterns sense a magnetic field or an electromagnetic signal applied from an outside source, and wherein at least a part of the support plate is disposed on a path along which the magnetic field or the electromagnetic signal is transmitted.

3. The display device of claim 2, wherein the support plate has a relative permeability in a range of 1.0 to 1.1.

4. The display device of claim 1, wherein the first surface unevenness is formed by reflecting level differences created by the plurality of conductive patterns.

5. The display device of claim 1, further comprising:
   an adhesive disposed between the support plate and the digitizer,
   wherein the support plate is coupled with the digitizer by the adhesive.

6. The display device of claim 5, further comprising:
   a buffer disposed between the support plate and the digitizer and having second surface unevenness on a front surface thereof.

7. The display device of claim 6, wherein the second surface unevenness is formed by reflecting level differences of the support plate that are created by the plurality of conductive patterns.

8. The display device of claim 1, wherein the display device further comprises a folding area, a first non-folding area disposed on one side of the folding area, and a second non-folding area disposed on an opposite side of the folding area, and
   wherein the support plate is disposed across the first non-folding area, the folding area, and the second non-folding area.

9. The display device of claim 1, wherein the buffer layer is affixed to the support plate with a first adhesive layer and the buffer layer is affixed to the digitizer with a second adhesive layer.

10. The display device of claim 1, wherein the buffer layer includes an elastic material.

11. A display device, comprising:
    a display panel having a front surface displaying an image and a rear surface opposite to the front surface;
    a rear-side layer disposed on the rear surface of the display panel, the rear-side layer comprising a plurality of conductive patterns and having first surface unevenness on a front surface thereof, the front surface facing the display panel; and
    a support plate disposed between the display panel and the rear-side layer and having a flat front surface that faces the display panel,
    wherein the support plate comprises glass or ceramic,
    wherein the display device further comprises a folding area, a first non-folding area disposed on one side of the folding area, and a second non-folding area disposed on an opposite side of the folding area,
    wherein the support plate is disposed across the first non-folding area, the folding area, and the second non-folding area, and
    wherein a density of the support plate at the folding area is smaller than a density of the support plate at the first non-folding area and the density of the support plate at the folding area is also smaller than the density of the support plate at the second non-folding area.

12. The display device of claim 11, wherein the folding area is extended in a first direction, wherein the first non-folding area and the second non-folding area are each configured to be folded in a second direction intersecting the first direction, and wherein the support plate includes at least one opening at the folding area extended in the first direction.

13. The display device of claim 12, wherein a width of the at least one opening, in the first direction, is less than ⅔ a width of the first non-folding area in the first direction.

14. The display device of claim 8, wherein the support plate is contiguous and integrally formed across the first non-folding area, the folding area, and the second non-folding area.

15. The display device of claim 14, wherein the digitizer comprises a first digitizer at least partially disposed in the first non-folding area and a second digitizer at least partially disposed in the second non-folding area, and
    wherein the first digitizer and the second digitizer are spaced apart from each other at the folding area.

16. A display device, comprising:
a display panel having a front surface displaying an image and a rear surface opposite to the front surface, the display panel comprising a folding area that is bendable, a first non-folding area extended from a first folding line disposed on one side of the folding area, and a second non-folding area extended from a second folding line disposed on an opposite side of the folding area;
a rear-side layer disposed on a rear surface of the display panel and having first surface unevenness on a front surface thereof, the front surface of the rear-side layer facing the display panel; and
a support plate disposed between the display panel and the rear-side layer and comprising a pattern portion overlapping the folding area and comprising a plurality of openings, a first flat portion overlapping the first non-folding area and having a flat surface on a front surface thereof, and a second flat portion overlapping the second non-folding area,
wherein the front surface of the support plate faces the display panel,
wherein a density of the support plate at the folding area is smaller than a density of the support plate at the first non-folding area and the density of the support plate at the folding area is also smaller than the density of the support plate at the second non-folding area.

17. The display device of claim 16, wherein the rear-side layer comprises a digitizer layer comprising a plurality of conductive patterns.

18. The display device of claim 16, wherein the rear-side layer comprises a magnetic shield containing magnetic metal powder.

19. The display device of claim 16, wherein the support plate comprises glass and/or ceramic.

20. The display device of claim 16, wherein the pattern portion comprises a plurality of bars connected to the first flat portion.

21. The display device of claim 20, wherein the pattern portion comprises a grid pattern formed by the plurality of bars and the plurality of openings, and wherein a width of some of the plurality of bars that are extended in a direction parallel to the first folding line is greater than a width of others of the plurality of bars that are extended in a direction perpendicular to the first folding line.

22. A display device, comprising:
a front stack structure;
a rear stack structure; and
a display panel disposed between the front stack structure and the rear stack structure and having a display area and a non-display area at least partially surrounding the display area, the display panel further having a folding area and a non-folding area disposed on two opposite sides of the folding area,
wherein the rear stack structure includes a plurality of conductive patterns having an uneven surface and a support plate comprising glass or ceramic, and
wherein a density of the support plate at the folding area is smaller than a density of the support plate at the non-folding area due to the support plate including a plurality of closed slits within the folding area and a plurality of open slits within the folding area, the closed slits being openings that are entirely surrounded by bar structures of the support plate, and the open slits being openings that are partially surrounded by the bar structures of the support plate and have at least a side open to the outside.

23. The display device of claim 22, wherein the front stack structure includes:
a window;
a window protection film; and
a polarizing film.

24. The display device of claim 22, wherein the rear stack structure further includes:
a panel-bottom protection film;
a buffer layer;
a digitizer layer;
a shielding layer; and
a heat dissipation layer.

* * * * *